(12) United States Patent
St. Germain et al.

(10) Patent No.: US 11,710,686 B2
(45) Date of Patent: *Jul. 25, 2023

(54) SEMICONDUCTOR PACKAGE STRUCTURES AND METHODS OF MANUFACTURE

(71) Applicant: SEMICONDUCTOR COMPONENTS INDUSTRIES, LLC, Phoenix, AZ (US)

(72) Inventors: Stephen St. Germain, Gilbert, AZ (US); Jay A. Yoder, Phoenix, AZ (US); Dennis Lee Conner, Peoria, AZ (US); Frank Robert Cervantes, Laveen, AZ (US); Andrew Celaya, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/457,148

(22) Filed: Dec. 1, 2021

(65) Prior Publication Data

US 2022/0084920 A1 Mar. 17, 2022

Related U.S. Application Data

(63) Continuation of application No. 16/554,980, filed on Aug. 29, 2019, now Pat. No. 11,217,515, which is a (Continued)

(51) Int. Cl.
*H01L 23/498* (2006.01)
*H01L 21/56* (2006.01)
(Continued)

(52) U.S. Cl.
CPC ...... *H01L 23/49805* (2013.01); *H01L 21/568* (2013.01); *H01L 23/3107* (2013.01);
(Continued)

(58) Field of Classification Search
CPC .............................. H01L 21/48; H01L 23/495
See application file for complete search history.

(56) References Cited

U.S. PATENT DOCUMENTS 6,348,726 B1 2/2002 Bayan et al.

OTHER PUBLICATIONS

GQFN Package Data Sheet, published by UTAC Holdings Ltd. at least as early as Mar. 2015, available online at https://www.utacgroup.com/images/White-Paper/GQFN_Package_Data_Sheet_March_2015.pdf, last visited Jul. 25, 2019.
(Continued)

*Primary Examiner* — Mounir S Amer
(74) *Attorney, Agent, or Firm* — Adam R. Stephenson, Ltd.

(57) ABSTRACT

Methods of forming semiconductor packages include providing a lead frame having leads and no tie-bars. Tape is attached to the lead frame and one or more semiconductor die are coupled therewith. Electrical contacts of the die are interconnected with the leads using electrical connectors. An encapsulated assembly is formed by at least partially encapsulating the die and electrical connectors. The assembly is singulated to form a semiconductor package. The tape is detached from the package or encapsulated assembly. One or more die attach flags may be attached to the tape and the die may be attached thereto. Semiconductor packages formed using the methods include one or more semiconductor die at least partially encapsulated, pins exposed through the encapsulant, electrical connectors within the encapsulant and electrically interconnecting the pins with electrical contacts of the die, and no tie-bars coupling the die with the pins. Packages may also include die attach flags.

20 Claims, 13 Drawing Sheets

Related U.S. Application Data continuation-in-part of application No. 15/833,533, filed on Dec. 6, 2017, now Pat. No. 10,522,448, which is a continuation of application No. 15/391,960, filed on Dec. 28, 2016, now Pat. No. 9,870,986, which is a continuation of application No. 14/484,141, filed on Sep. 11, 2014, now Pat. No. 9,558,968.

(51) Int. Cl.
*H01L 23/495* (2006.01)
*H01L 23/31* (2006.01)

(52) U.S. Cl.
CPC .. *H01L 23/49524* (2013.01); *H01L 23/49562* (2013.01); *H01L 23/49575* (2013.01); *H01L 23/49811* (2013.01); *H01L 23/49861* (2013.01); *H01L 2924/0002* (2013.01); *H01L 2924/181* (2013.01)

(56) References Cited

OTHER PUBLICATIONS

NCP5339—Integrated Driver & MOSFETs, published by ON Semiconductor at least as early as Oct. 2016, available online at https://www.onsemi.com/pub/Collateral/NCP5339-D.PDF, last visited Jul. 25, 2019.

SEMICONDUCTOR PACKAGE STRUCTURES AND METHODS OF MANUFACTURE

CROSS REFERENCE TO RELATED APPLICATIONS

This application is a continuation application of the earlier U.S. Utility patent application Ser. No. 16/554,980, entitled "Semiconductor Package Structures and Methods of Manufacture," listing as first inventor Stephen St. Germain, filed Aug. 29, 2019, now pending, which in turn is a continuation-in-part application of the earlier U.S. Utility patent application Ser. No. 15/833,533, entitled "Single or Multi Chip Module Package and Related Methods," listing as first inventor Stephen St. Germain, issued Dec. 31, 2019 as U.S. Pat. No. 10,522,448, which in turn is a continuation of U.S. Utility patent application Ser. No. 15/391,960, entitled "Single or Multi Chip Module Package and Related Methods," listing as first inventor Stephen St. Germain, filed Dec. 28, 2016, issued Jan. 16, 2018 as U.S. Pat. No. 9,870,986, which in turn is a continuation of U.S. Utility patent application Ser. No. 14/484,141, entitled "Single or Multi Chip Module Package and Related Methods," listing as first inventor Stephen St. Germain, filed Sep. 11, 2014, issued Jan. 31, 2017 as U.S. Pat. No. 9,558,968, the disclosures of each of which are hereby incorporated entirely herein by reference.

BACKGROUND

1. Technical Field

Aspects of this document relate generally to semiconductor packages. More specific implementations involve lead frames used in the formation of semiconductor packages.

2. Background

Semiconductor packages are often formed by coupling one or more die with die attach flags of a lead frame, electrically interconnecting electrical contacts of the die with leads of the lead frame using electrical connectors, at least partially encapsulating the die and electrical connectors in an encapsulant to form an encapsulated assembly, and singulating the encapsulated assembly. The lead frame supports the die during package fabrication and the singulated leads of the lead frame form electrical pins exposed through the encapsulant to electrically couple the package with a printed circuit board (PCB).

SUMMARY

Implementations of a method of forming a no tie-bar semiconductor package may include: providing a lead frame having a plurality of leads, the lead frame having no tie-bars; attaching a tape to the lead frame; coupling one or more semiconductor die with the tape, wherein the one or more semiconductor die includes a plurality of electrical contacts; and electrically interconnecting one or more of the electrical contacts with one or more of the leads using electrical connectors. The method may include forming an encapsulated assembly, by at least partially encapsulating the one or more semiconductor die and at least partially encapsulating each of the electrical connectors using an encapsulant. The method may also include singulating the encapsulated assembly to form a semiconductor package; and detaching the tape from the semiconductor package and/or the encapsulated assembly.

Implementations of a method of forming a semiconductor package may include one, all, or any of the following:

The semiconductor package may include a power converter and/or a power controller.

The lead frame may have no die attach flags.

The electrical connectors may include wirebonds.

The method may include attaching one or more die attach flags to the tape. Coupling the one or more semiconductor die with the tape may include attaching the one or more semiconductor die to the one or more die attach flags using a die attach material.

The method may include using vacuum assist to hold down the one or more die attach flags while attaching the one or more semiconductor die to the one or more die attach flags. The method may include using vacuum assist while electrically interconnecting one or more of the electrical contacts with one or more of the leads using the electrical connectors.

The tape may be configured to retain its shape and adhesiveness at temperatures exceeding 240 degrees Celsius.

The tape may have an adhesive layer with a thickness of 3 mils or less.

The semiconductor package may have no electrical contacts of the one or more semiconductor die exposed through the encapsulant.

The method may include no etching step, apart from any etching used for singulation, after the one or more semiconductor die are coupled with the tape.

The method may include only one encapsulating step.

The method may include no sawing step, apart from any sawing used for singulation, after at least partially encapsulating the one or more semiconductor die using the encapsulant.

Implementations of a method of forming a no tie-bar semiconductor package may include: providing a lead frame having a plurality of leads, the lead frame having no tie-bars and no die attach flags; attaching a tape to the lead frame; attaching a plurality of die attach flags to the tape; and attaching a plurality of semiconductor die to the die attach flags using a die attach material, wherein each of the semiconductor die includes a plurality of electrical contacts. The method may include electrically interconnecting one or more of the electrical contacts with one or more of the leads using electrical connectors and forming an encapsulated assembly, by at least partially encapsulating each of the semiconductor die and at least partially encapsulating each of the electrical connectors using an encapsulant. The method may also include singulating the encapsulated assembly to form a semiconductor package; and detaching the tape from the semiconductor package and/or the encapsulated assembly; wherein the semiconductor package forms a flat no-leads package.

Implementations of a method of forming a no tie-bar semiconductor package may include one, all, or any of the following:

The tape may be configured to retain its shape and adhesiveness at temperatures exceeding 240 degrees Celsius.

The tape may have an adhesive layer with a thickness of 3 mils or less.

The semiconductor package may expose none of the electrical contacts of the semiconductor die through the encapsulant.

The method may include no etching step, apart from any etching used for singulation, after the plurality of semiconductor die are attached to the die attach flags.

The method may include only one encapsulating step.

The method may include no sawing step, apart from any sawing used for singulation, after at least partially encapsulating the plurality of semiconductor die using the encapsulant.

Implementations of no tie-bar semiconductor packages may include: one or more semiconductor die at least partially encapsulated within an encapsulant, the one or more semiconductor die having a plurality of electrical contacts; a plurality of pins exposed through the encapsulant; and a plurality of electrical connectors encapsulated within the encapsulant and electrically interconnecting one or more of the pins with one or more of the electrical contacts; wherein the semiconductor package forms a flat no-leads semiconductor package. In various package implementations, none of the semiconductor die may be coupled with any of the pins through a tie-bar; and none of the electrical contacts may be exposed through the encapsulant.

Implementations of no tie-bar semiconductor packages may include one, all, or any of the following:

One or more die attach flags may be at least partially encapsulated within the encapsulant, each of the one or more semiconductor die may be attached to one of the one or more die attach flags using a die attach material, and none of the one or more die attach flags may be coupled with any of the pins through a tie-bar.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended structures and methods of no tie-bar packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such structures and methods of no tie-bar packages, and implementing components and methods, consistent with the intended operation and methods.

Figure 12:
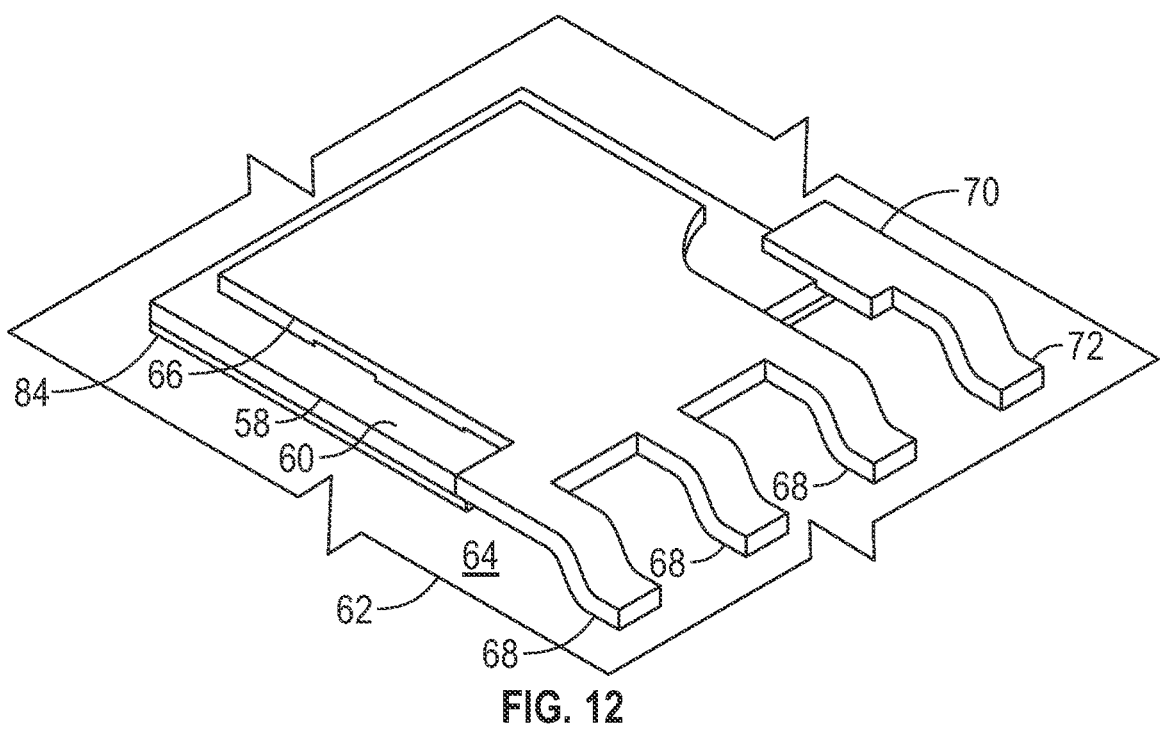
FIG. 12 is a top perspective view of elements of an implementation of a semiconductor device package adhered to an adhesive surface of an adhesive tape.
Figure 13:
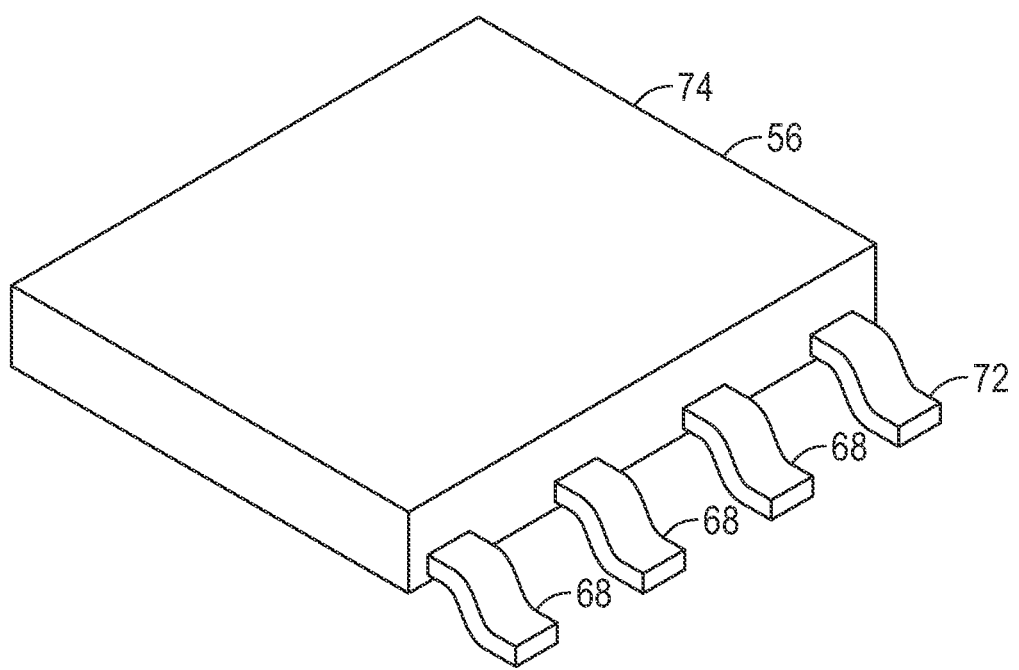
FIG. 13 is a top perspective view of an implementation of a semiconductor device package.

Referring now to FIGS. 1-11, in implementations a semiconductor device package 2 includes one or more semiconductor die (die) 6, 12, 20, and/or 34, one or more clips 46 and/or 50, and a mold compound (encapsulating compound) 54. Referring to FIGS. 12-13, in various implementations a semiconductor device package 56 includes a semiconductor die (die) 58, one or more clips 66 and/or 70 having leads 68 and/or 72, and a mold compound (encapsulating compound) 74.

Figure 1:
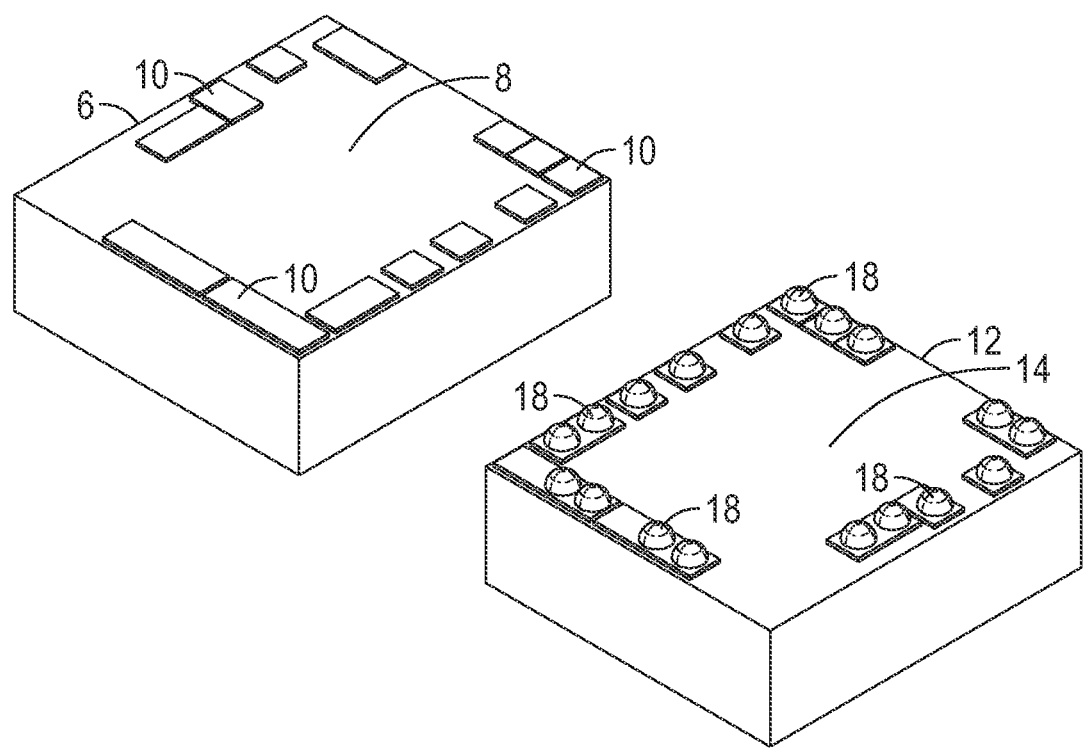
FIG. 1 is a top perspective view of two implementations of die of a semiconductor device package.
Figure 2:
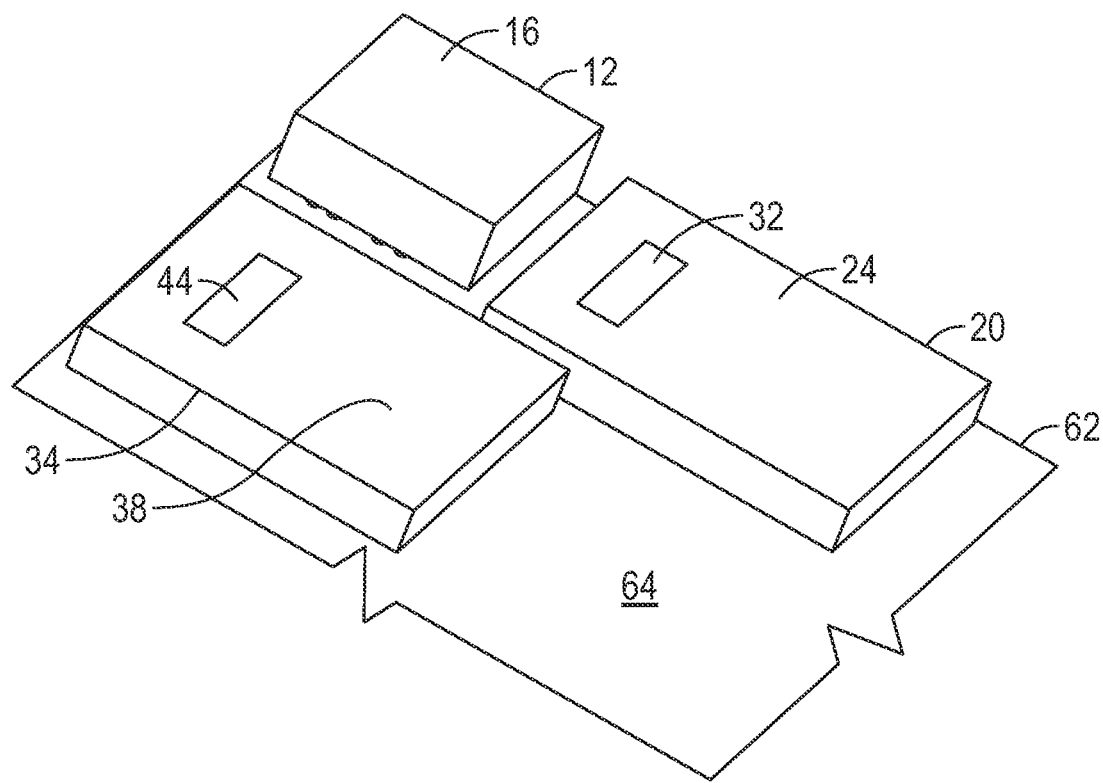
FIG. 2 is a top perspective view of three implementations of die of a semiconductor device package adhered to an adhesive surface of an adhesive tape.
Figure 3:
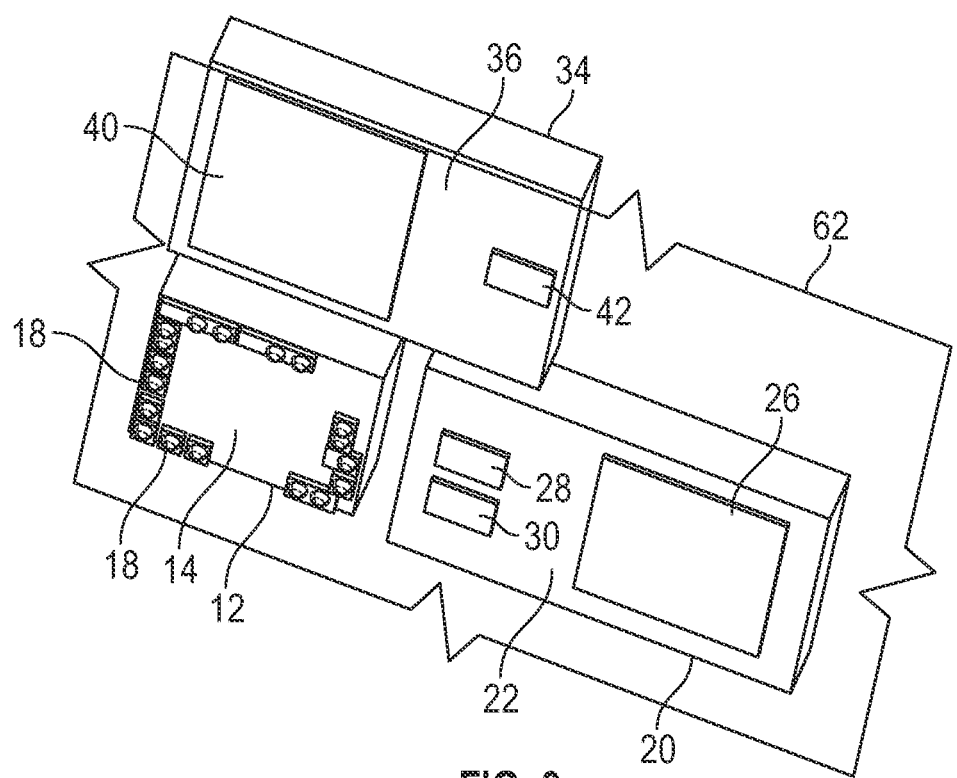
FIG. 3 is a bottom perspective view of the die and adhesive tape of FIG. 2 with the adhesive tape drawn in see-through fashion so that the bottom surfaces of the die may be viewed.

Referring now to FIGS. 1 and 2, implementations of semiconductor packages disclosed herein are formed using implementations of a method of forming a semiconductor device package 2. The method 2 includes placing a die 12 on an adhesive surface 64 of an adhesive tape (mold tape) 62. Die 12 includes a plurality of electrical contacts 18 on a first face 14. The electrical contacts 18 on the die 12 shown in the drawings are bumps (stud bumps). In implementations a semiconductor device package could include a die 6 which is generally similar, or in some cases identical, to die 12, except that the electrical contacts 10 on the first face 8 of die 6 are pads instead of bumps.

In implementations a semiconductor device package may include only a single die, as in the semiconductor device package 56 of FIG. 13, for example, which includes (referring to FIG. 12) only a single die 58. In implementations of making such a package, the method includes placing the single die 58 so that electrical contacts on a first face of the die 58 contact the adhesive surface 64 of the adhesive tape 62. A clip 66 is mechanically and electrically coupled to one or more electrical contacts on a second face 60 of the die 58 and placed so that leads 68 of the clip 66 contact the adhesive surface 64. The second face 60 of the die 58 is on an opposing side of the die 58 from the first face of the die 58. In the implementation shown a clip 70 is also included which is mechanically and electrically coupled to one or more electrical contacts on the second face 60 of the die 58 and placed so that a lead 72 of the clip 70 contacts the adhesive surface 64. In other implementations only a single clip could be used instead of a clip 66 and a clip 70 and/or the clip(s) could have different configurations—for instance the semiconductor device package could contain more or less leads such as one, two, three, five, six, seven, or more leads. In the implementation shown if FIGS. 12-13 the leads are gull-wing leads but in other implementations they could have any other shape and configuration, for instance the package could be formed so that the leads 68, 72 are substantially flush with the outer faces of the package to form a flat no-leads package. Additionally, in the implementation shown in FIGS. 12-13 all of the leads exit the same side face of the semiconductor device package 56 but, in other implementations, the clips could be configured so that the leads exit two opposing side faces (such as, by non-limiting example, to form a dual in-line package (DIP or DIL)), or so that the leads exit three side faces, or so that the clips exit four side faces (such as, by non-limiting example, to form a quad flat package (QFP)).

In various implementations a semiconductor device package may include a plurality of die. Referring to FIGS. 2, a die 12 is positioned so that electrical contacts 18 on a first face 14 of the die 12 contact the adhesive surface 64, a die 20 is positioned so that contact 26 and electrical contacts 28 and 30 on a first face 22 of the die 20 contact the adhesive surface 64, and die 34 is positioned so that contact 40 and electrical contact 42 on a first face 36 of the die 34 contact the adhesive surface 64. Contacts 26 and 40 in the implementations shown are electrical contacts, though in implementations they could be additionally or alternatively heat sinks and/or other heat transfer structures/devices could be located on the first faces 14, 22, 36 to transfer heat from the die to a motherboard.

Die 20 includes an electrical contact 32 on a second face 24 which is on an opposing side of the die 20 from the first face 22. Die 34 includes an electrical contact 44 on a second face 38 which is on an opposing side of the die 34 from the first face 36. Die 12 has a second face 16 which is on an opposing side of the die 12 from the first face 14. In the implementations shown there are no electrical contacts on the second face 16 of die 12 (and in fact all of the electrical contacts of the die 12 are on the first face 22), though in other implementations the second face 16 could include electrical contacts and/or one or more or all of the side faces of the die 12 could include electrical contacts and/or heat sinks to allow external elements such as clips to electrically and/or mechanically couple thereto to allow communication between the integrated circuit (IC) elements of the die 12 with other elements. Similarly, although only one electrical contact (32 or 44) is shown on the second face (23 or 38) of each of die 20 and 34, respectively, in other implementations a plurality of electrical contacts and/or heat sinks could be present on those faces and/or on other faces of those die.

Figure 4:
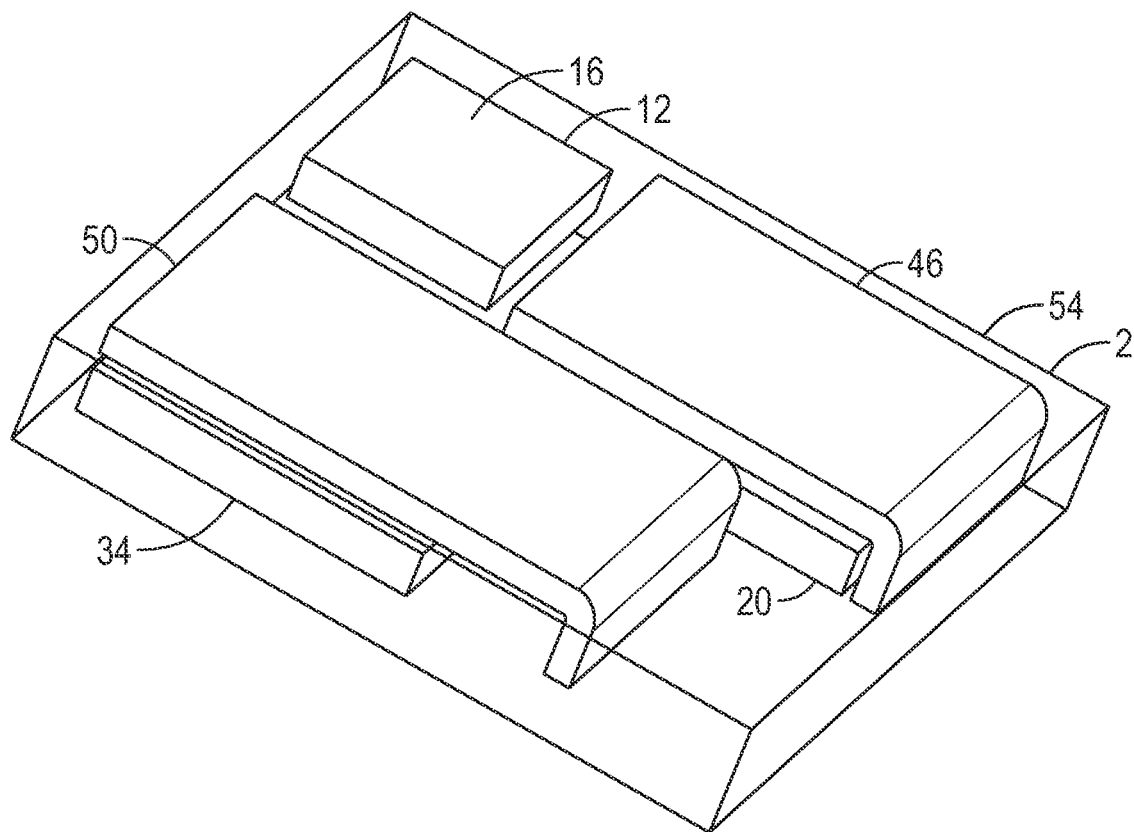
FIG. 4 is a top perspective view of an implementation of a semiconductor device package with the mold compound drawn in see-through fashion so that other elements may be viewed.
Figure 5:
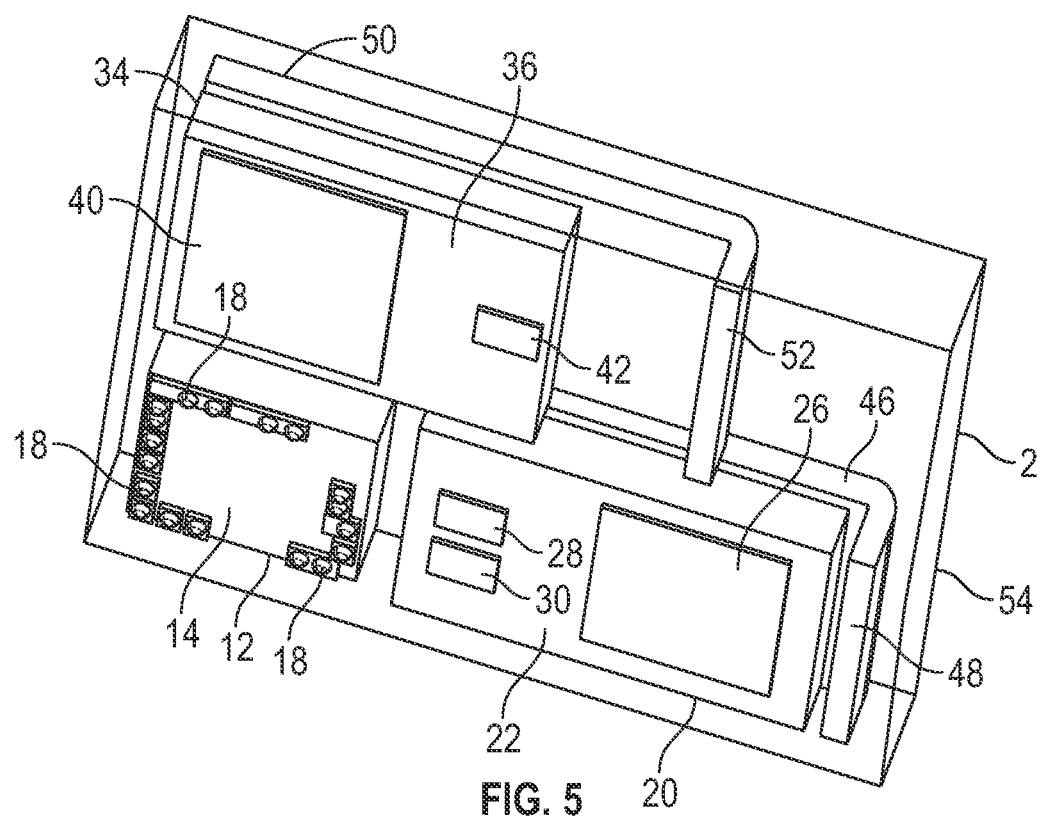
FIG. 5 is a bottom perspective view of the semiconductor device package of FIG. 4 with the mold compound drawn in see-through fashion so that other elements may be viewed.
Figure 6:
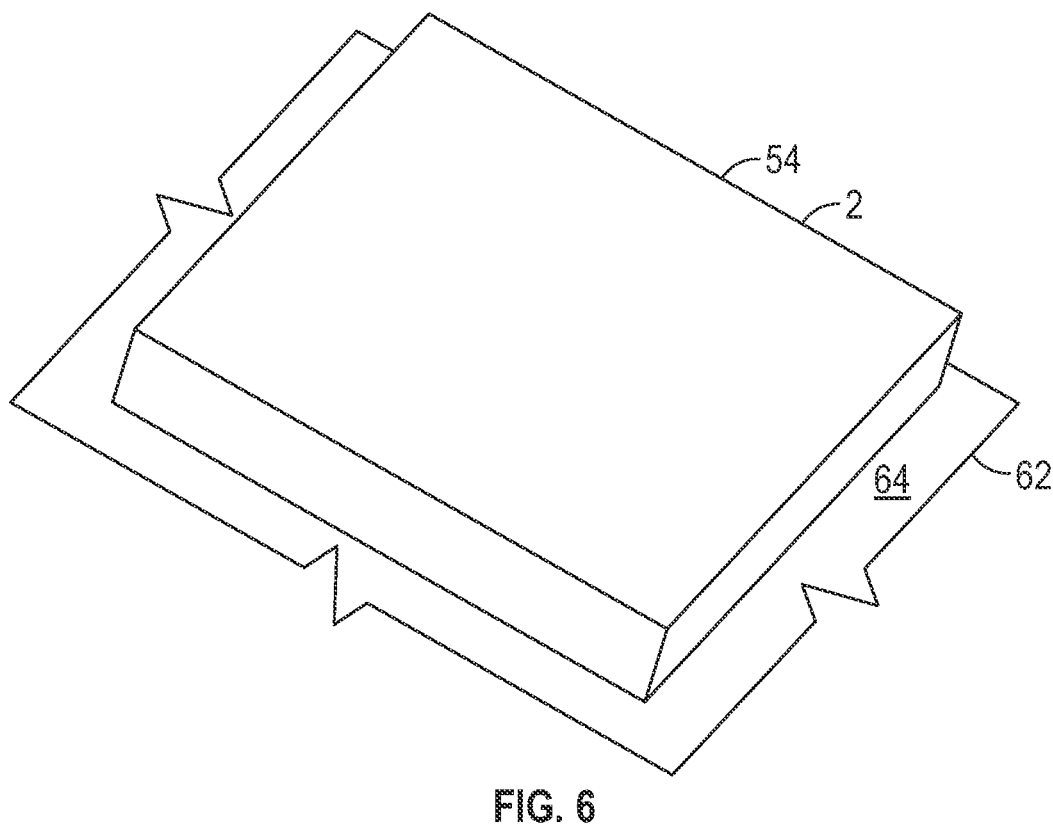
FIG. 6 is a top perspective view of the semiconductor device package of FIG. 4 adhered to an adhesive surface of an adhesive tape with the mold compound drawn in opaque fashion.

FIG. 4 shows clips 46 and 50 electrically coupled to die 20 and 34, respectively. Clip 46 is mechanically and electrically coupled to one or more electrical contacts (for example electrical contact 32) on the second face 24 and clip 50 is mechanically and electrically coupled to one or more electrical contacts (for example electrical contact 44) on the second face 38. Clip 46 may also be mechanically coupled, generally, to the second face 24 and clip 50 may also be mechanically coupled, generally, to the second face 38. The mechanical and electrical coupling may be accomplished, by non-limiting example, by a soldering process or by an adhesive process such as with an electrically conductive adhesive. Referring to FIG. 5, clip 46 has an electrical contact 48 which contacts the adhesive surface 64 and clip 50 has an electrical contact 52 which contacts the adhesive surface 64. After the clips are placed and are mechanically and electrically coupled to the electrical contacts of the respective die, a mold or encapsulating compound 54 is overmolded or encapsulated over the various elements in a liquid form and allowed to solidify. In implementations a single unit of compound 54 may be placed over a single group of elements to form a single semiconductor device package 2, for example as shown in FIGS. 4-8 (such as in punch singulation), though in other implementations a plurality of semiconductor device packages 2 could be formed on a single piece of adhesive tape 62 for example by placing down on the adhesive surface 64 a multitude of die and clips, overmolding or encapsulating the multitude of die and clips and then cutting or otherwise singulating each individual package 2 through a cutting, sawing or other separation process.

Figure 7:
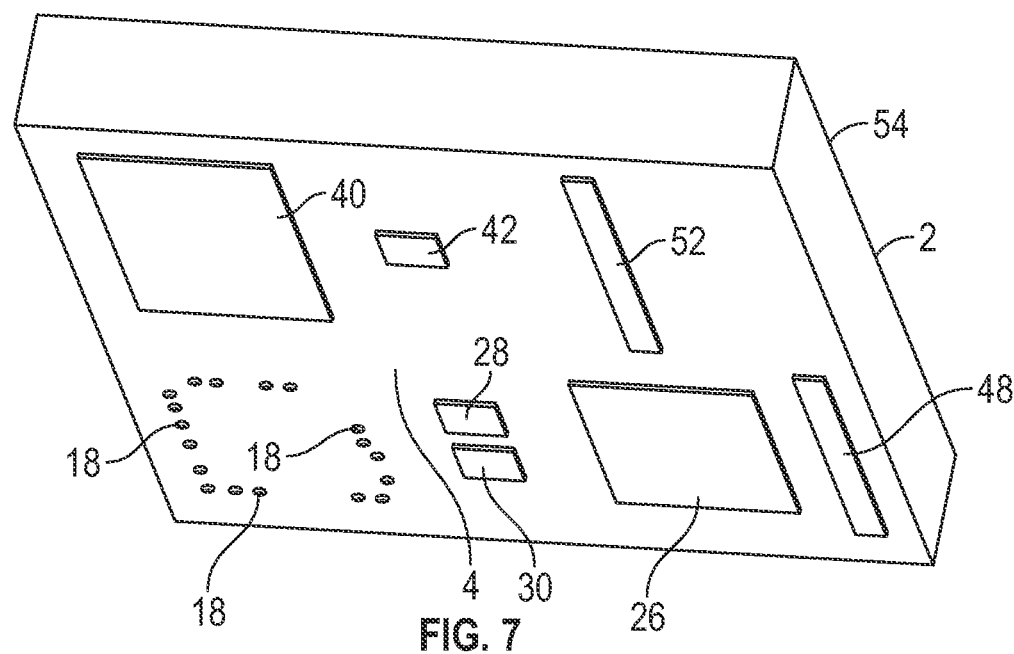
FIG. 7 is a bottom perspective view of the semiconductor device package of FIG. 5 with the mold compound drawn in opaque fashion.

In various implementations, the mold/encapsulating compound 54 is overmolded or placed so that it covers all of the elements of the package 2 except for a plurality of contacts on a first face 4 of the package 2. Referring to FIG. 7, for instance, the package 2 only has electrical contacts on a first face 4 of the package 2 which, after the overmolding or encapsulating process, is facing the adhesive surface 64. The package 2 is then removed from the adhesive surface 64 to reveal or otherwise expose the contacts. The FIG. 7 implementation of package 2 shows that the following contacts are exposed through the first face 4 of the package 2: contacts 40 and 28 (which in the implementations shown are electrical contacts but which in other implementations may additionally or alternatively be heat sinks), electrical contacts 28, 30, 42, 48, 52, and a number of electrical contacts 18 (not all of the electrical contacts 18 are numbered in the drawings but all of them have the same general shape, as all are bumps in the representative example). The package 2 thus may be a flat no-leads package. In various method implementations, a package could similarly be formed into a quad flat no-leads package (QFN) configuration, a dual flat no leads (DFN) package configuration, a micro lead frame (MLF) configuration, a small-outline no leads (SON) configuration, and many other package types.

For a package which includes no leads, such as package 2, the overmolding or encapsulating process may include encapsulating or overmolding the elements of the package 2 except for the first faces of the die which are facing the adhesive surface 64 (such as the first faces 8, 14, 22, 36), and overmolding a majority of the clips (or all of the clips except for the electrical contacts 48, 52) while leaving the contacts and electrical contacts of the first faces 8, 14, 22 and/or 36 exposed. The overmolding or encapsulating process may alternatively include overmolding or encapsulating a portion of the first faces 8, 14, 22 and/or 36 but without overmolding or encapsulating the electrical contacts on the first faces 8, 14, 22 and/or 36 (for example if the contacts/electrical contacts include pads or stud bumps which extend sufficiently outwards from the first faces 8, 14, 22 and/or 36 such a process may be utilized to cover the first faces 8, 14, 22 and/or 36 except for the contacts/electrical contacts).

For a package which includes leads, such as package 56, the overmolding or encapsulating process may similarly include encapsulating or overmolding the elements of the package 56 except for the first face of die 58 (which is on an opposing side of the die 58 from a second face 60 of the die 58), and overmolding a majority of the clips 66, 70 while leaving the leads 68, 72 and the electrical contacts on the first face of the die 58 exposed. The overmolding or encapsulating process may alternatively include overmolding or encapsulating a portion of the first face of the die 58 but without overmolding or encapsulating the electrical contracts on the first face of the die 58, similar to the process described above for package 2.

Thus, in various implementations the contacts and electrical contacts of the die and clips are not overmolded and are not encapsulated in the overmolding/encapsulating process. The overmolding or encapsulating compounds 54, 74 may be, or may include, by non-limiting example, a thermosetting or thermoplastic polymer, a thermosetting resin, an epoxy resin, and other polymeric or composite flowable materials.

In the implementations illustrated, all of the electrical (and any heat sink) contacts of the package 2 are exposed only through the first face 4. In other implementations a semiconductor device package could have, additionally, electrical and/or heat sink contacts exposed through any other face of the package and/or may include leads extending substantially past a face so that they are substantially not flush with the face, similar to how the leads 68/72 of package 56 extend substantially past the side face from which they exit so that they are not substantially flush with the side face. In contrast, all of the contacts and electrical contacts shown in the FIG. 7 implementation of package 2 are at least substantially flush with the first face 4 of package 2.

Figure 8:
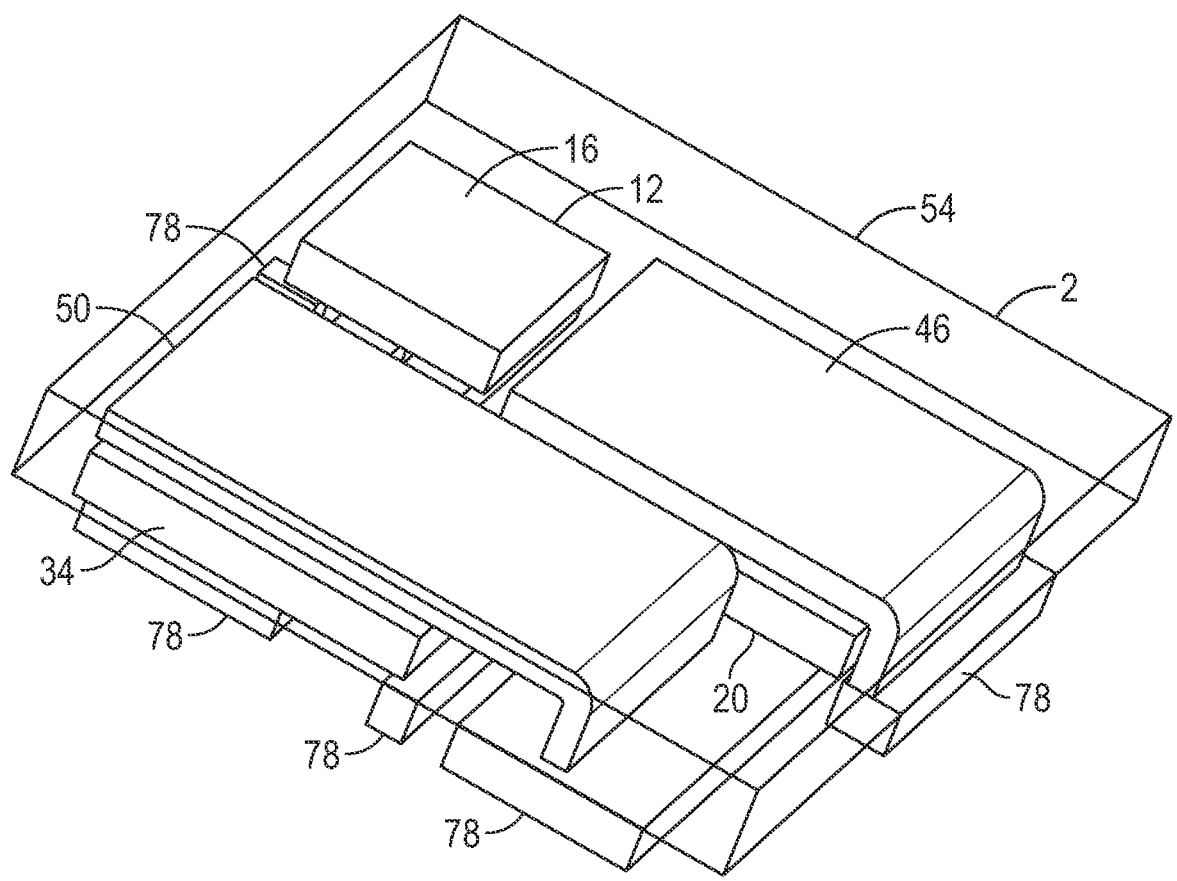
FIG. 8 is a top perspective view of the semiconductor device package of FIG. 4 and a plurality of conductive paths of a motherboard, with the mold compound drawn in see-through fashion so that other elements may be viewed.
Figure 9:
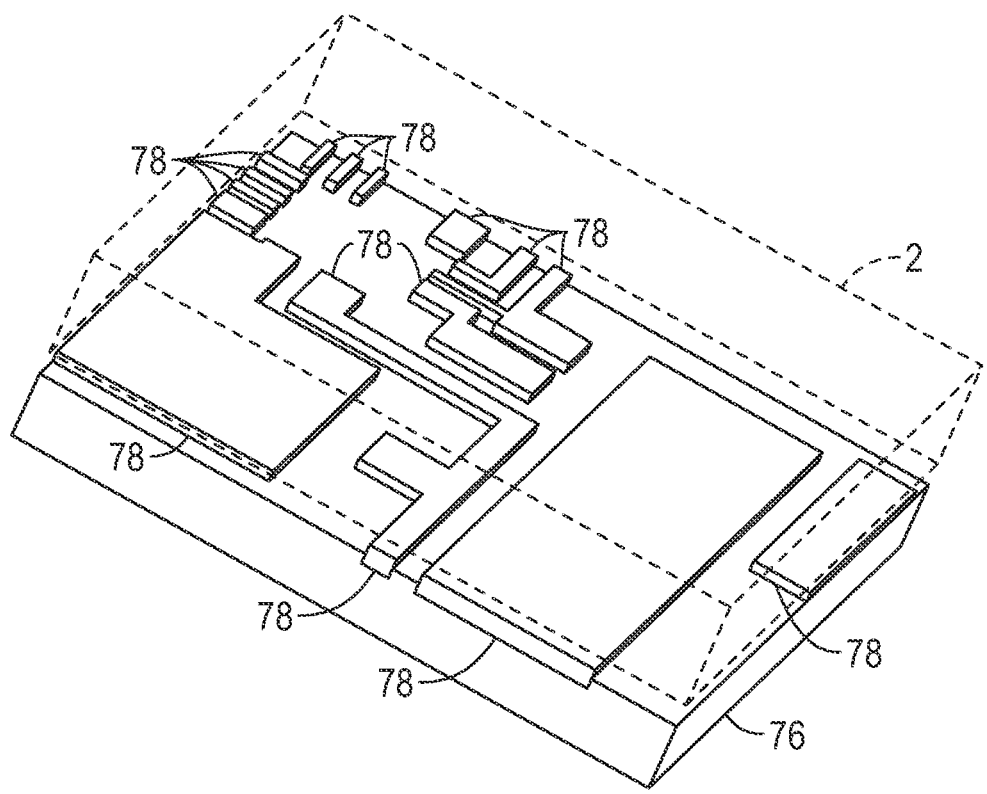
FIG. 9 is a top perspective view of a motherboard with conductive paths, with a dashed outline showing the location of a semiconductor device package on the motherboard.
Figure 10:
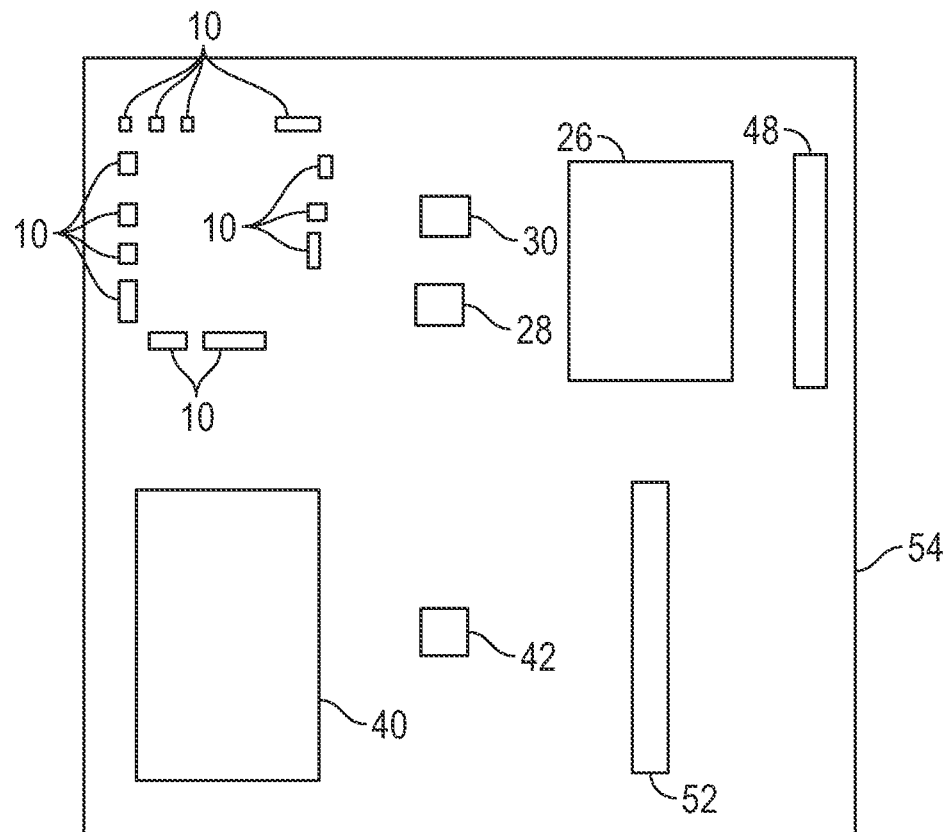
FIG. 10 is a top see-through view of a semiconductor device package showing only the mold compound and various contacts on the bottom of the semiconductor device package.
Figure 11:
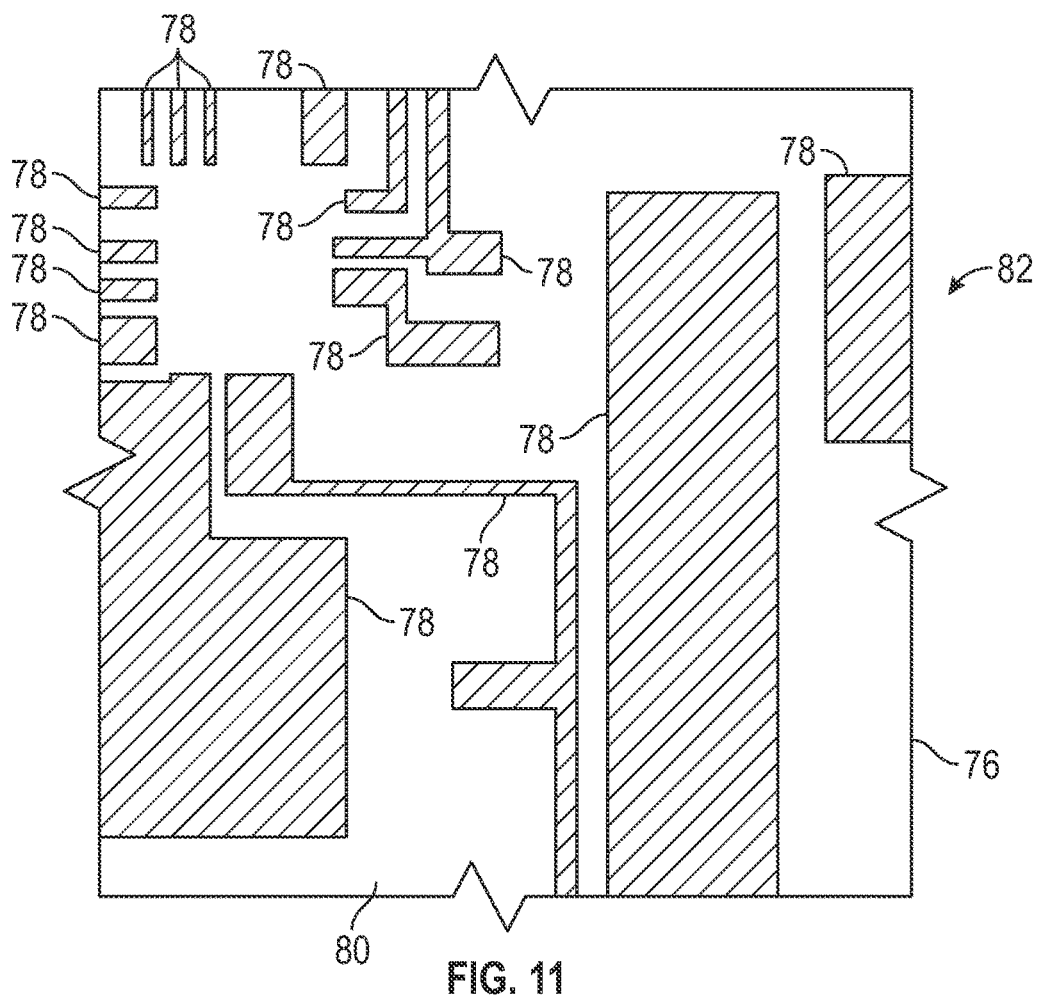
FIG. 11 is a top view of a distribution layer of a motherboard.

As shown in FIGS. 7-11, the electrical contacts shown in FIG. 7 are configured to align with conductive paths 78 on an upper face 80 of a motherboard 76. FIG. 9 is a top perspective view of a motherboard 76 with conductive paths 78, with a dashed outline showing the location of the package 2 on the motherboard 76. FIG. 10 is a top see-through view of a semiconductor device package similar to package 2 but which includes die 6 in place of die 12, the figure showing only the mold compound 54, contacts 26, 40 and electrical contacts 10, 26, 28, 30, 42, 48, 52. FIG. 11 shows a top view of a distribution layer 82 of a motherboard 76 including the conductive paths 78 located on the upper face 80, the distribution layer 82 configured to electrically couple each of the contacts and electrical contacts shown in FIG. 10 to at least one conductive path 78. The practitioner may envision how the contacts/electrical contacts shown in FIG. 10 align with the conductive paths 78 of FIG. 11 when the package is placed on the motherboard 76. The contacts and electrical contacts of the package 2/56 may be electrically and mechanically coupled to the conductive paths 78 of the distribution layer 82, by non-limiting example, using a soldering process or by an adhesion process such as with an electrically conductive adhesive.

As can be seen in FIG. 8, in implementations one or more of the clips may be configured to couple die together through the motherboard 76. Clip 50 of FIG. 8 is shown electrically coupling die 34 with die 20 through one of the conductive paths 78.

In implementations package 2 includes a driver metal-oxide-semiconductor field-effect transistor (DrMOS). The package 2 may be configured to perform high-current DC-DC buck power conversion applications. In implementations package 2 includes a metal-oxide-semiconductor field-effect transistor (MOSFET) driver, a high-side MOSFET (HS-FET) and a low-side MOSFET (LS-FET). Die 6/12 may be a driver and may have a size of, or of about, 0.86 mm by 0.94 mm by 0.2032 mm. Die 20 may be a HS-FET and may have a size of, or of about, 1.55 mm by 1.22 mm by 0.106 mm. Die 34 may be a LS-FET and may have a size of, or of about, 1.44 mm by 1.33 mm by 0.1016 mm. Clips 46 and 50 may be formed clips each having a thickness of, or of about, 0.125 mm. Molding/encapsulation compound 54 may be, or may include, an epoxy resin sold under the trade name G770 SERIES and/or G770HCD by Sumitomo Bakelite Co., Ltd. of Tokyo, Japan. Solder used to couple elements of the package 56 together may be, or may include, an 85 wt % tin 15 wt % lead (SnPb 85/15) solder, or any other solder. Package 2 may have a size of, or of about, 3 mm by 3 mm by 0.5 mm.

In other implementations package 56 is a small outline 8-pin flat leads (SO8FL) package that includes no wire bonds and no lead frame. Die 58 may be or may include a MOSFET. Package 56 may have a size of, or of about, 6 mm by 5 mm by 0.5 mm. Die 58 may have a thickness of, or of about, 0.2032 mm, though the thickness may vary depending on the application. Clips 66 and 70 may each have a thickness of, or of about, 0.125 mm. Molding/encapsulation compound 74 may be, or may include, an epoxy resin sold under the trade name G770 SERIES and/or G770HCD by Sumitomo Bakelite Co., Ltd. Solder used to couple elements of the package 56 together may be, or may include, an 85 wt % tin 15 wt % lead (SnPb 85/15) solder, or any other solder. Package 56 may be sized to be coupled to a motherboard that is configured to receive a 6 mm by 5 mm by 1 mm SO8FL package.

The adhesive tape 62 may be mold tape such as is currently used in molding processes for semiconductor packages that include lead frames. In implementations the electrical contacts of the die and other components may include copper pillars, bumps, pads and the like. These may be created and/or attached to die and other components prior to their placement on the adhesive tape 62. The adhesive tape 62 may be a high temperature tape that is held by a tape carrier (carrier ring) while die, discretes (capacitors, resistors, transistors, and any other electronic components each with just one circuit element, passive or active, other than an integrated circuit) and other components are placed, with electrical contacts down, on the adhesive tape 62. Solder may then be applied to the top of the die or other components, then the clips may be positioned and the solder reflowed to electrically and mechanically attach the clips to the die and/or other components. The array may then be molded in a transfer mold using mold compound 54 or 74. The molded array may be laser marked, and before or after laser marking the array may be removed from the adhesive tape 62. Following laser marking and removal of the array from the adhesive tape 62 the array may be sawed (saw singulation) or otherwise singulated using any separation technique. In implementations wherein a package is independently formed (punch singulation) the same or similar steps may be followed except for the sawing step which will be unnecessary.

In implementations a package after molding or encapsulating may leave a portion of one or more clips, or other components, exposed for the release of heat and/or to attach a heat sink thereto. For example, the sides/faces of the clips corresponding with (i.e., parallel or substantially parallel with and facing the same or substantially the same direction) the second faces 16, 24, 38, 60 of die may be exposed or partially exposed, and/or one or more of the second faces 16, 24, 38 and/or 60 themselves may be exposed or partially exposed, for this purpose. One or more die, clips or other components may be exposed in this manner for stacked package applications, i.e., package on package (PoP). In PoP implementations, lead frames, clips and/or wire bonds may be used to accomplish stacking amongst packages. Die, discretes and other components may also be stacked face up or down with other components within the package and/or may be used to bridge between components within a package and/or may or may not be exposed or partially exposed after molding or encapsulating. Components within or partially within a package such as those described herein may also be used to provide mechanical standoffs for the package relative to the motherboard or betwixt elements within the package. Methods such as those disclosed herein may be utilized for stacking chips/die and/or packages in system in package (SIP) modules.

In other implementations, no portion of the die(s) will be exposed after the molding or encapsulating process except for the portions on which the electrical contacts and/or heat sinks are present. In implementations one or more of the die, clips, or other elements may be formed such as to prevent or hinder the molding or encapsulating compound 54, 74 from tending to separate from the components within the molding or encapsulating compound 54, 74 (thus creating one or more mold locks). In implementations in which a portion of the first face(s) 4, 8, 14, 22, 36 and/or 58 is/are covered by the mold compound 54 or 74, as discussed herein, this may form one or more mold locks and in implementations with sufficient stand-off height of the electrical contacts there may be no exposed die surfaces in the finished package. In multichip module (MCM) packages any number and combination of die(s), field-effect transistors (FETs), clip(s), discrete(s), and/or other components, and the like, may be used.

The adhesive tape 62 could be, by non-limiting example: a map molding support tape sold under the trade name RT SERIES by Hitachi Chemical Co., Ltd. of Tokyo, Japan; a heat resistant tape sold under the trade name PW/TRM series by Nitto Denko Corporation of Osaka, Japan; and the like. In implementations the adhesive tape 62 may be or may include a thick tape with low-force ultraviolet (UV) release adhesive and other UV release tape types of other thicknesses as well.

All of the contacts, electrical contacts and conductive paths discussed herein may be formed of metals, metallic alloys, or other generally electrically conductive materials, as opposed to generally electrically non-conductive materials such as most ceramic and polymeric materials.

One of the basic and novel characteristics of implementations of semiconductor device packages 2, 56 disclosed herein is the exclusion of any wire bonds. Another of the basic and novel characteristics of implementations of semiconductor device packages 2, 56 disclosed herein is the exclusion of any lead frame. One of the basic and novel characteristics of implementations of a method of forming a semiconductor device package 2, 56 disclosed herein is the exclusion of a step of including a wire bond in the semiconductor device package 2, 56 or otherwise electrically coupling elements of the semiconductor device package 2, 56 using wire bonds. Another of the basic and novel characteristics of implementations of a method of forming a semiconductor device package 2, 56 disclosed herein is the exclusion of a step of including a lead frame in the semiconductor device package 2, 56.

The elimination of wire bonds, interconnects and lead frames from the packages discussed herein result in a number of beneficial effects, any one or more of which may exist in packages constructed using the methods disclosed herein: reduction cost and build time for the package; reduction of area and height needed for the package on a motherboard and/or within an electronic device; improvement of electrical performance by eliminating long route paths within the package; provision for a tightly controlled package footprint, and; allowance for connections typically made in the package through wire bonds, clips and carriers (such as lead frames) to be made instead on a motherboard.

The distribution layer 82 and package 2/56 in implementations are configured so that a majority, or all, of the electrical components internal to the package 2/56 that in prior art packages would be electrically coupled to one another using wire bonds and/or a lead frame are now electrically coupled to one another via the distribution layer 82 of the motherboard 76 without requiring any wire bonds and/or without requiring any lead frame to make the connections. The distribution layer 82 and package 2/56 are configured so that a majority, or all, of the electrical components internal to the package 2/56 that in prior art packages would be electrically coupled to one another using wire bonds and/or a lead frame are now electrically coupled to one another through the distribution layer 82 of the motherboard 76 and one or more clips without any wire bonds and without any lead frame. By non-limiting example the package 2 shown in the drawings is configured so that all but two of the package 2 interconnects are accomplished through the distribution layer 82, while the remaining two interconnects are accomplished using the clips 46, 50. In implementations in which a package includes more than one die, such as with package 2, the distribution layer 82 and the package may be configured so that the distribution layer 82 distributes all inter-die electrical communications.

In implementations the methods disclosed herein may be utilized to reduce the size or otherwise modify any existing quad flat no leads (QFN) package or to create a package that may be used in any QFN application. In various implementations, conductive solderable contacts are used for all components that are placed onto the adhesive tape 62 and all the contacts that are placed down on the adhesive tape 62 are built up to provide sufficient height to allow for a standoff for solder contact to the motherboard. This standoff, when applicable, may provide mold locks, standoff for board mount and component protection.

Implementations of semiconductor device packages, such as package 56 shown in FIGS. 12-13, may include a die pad or die flag 84, and implementations of methods of forming a package 56 may accordingly include mechanically and electrically coupling one or more electrical contacts on a first face of die 58 (which is on an opposite side of the die 58 from the second face 60 of the die 58) with the die flag 84. In other implementations of semiconductor device packages the die flag 84 may be omitted, and the method of coupling one or more electrical contacts on a first face of the die 58 to the die flag 84 may accordingly be omitted, such that electrical contacts on a first face of the die 58 are instead coupled directly to conductive paths of the motherboard. For purposes of this disclosure the die pad or die flag 84 is considered a lead frame. Accordingly, in implementations in which the die pad or die flag 84 is excluded, the package 56 accordingly includes no lead frame.

In various implementations, a semiconductor device package may include no die and/or may include one or more passive components such as, by non-limiting example: resistors; capacitors; inductors; memristors; transducers; sensors; antennas; networks of passive components; and other electrical circuit components. Implementations of semiconductor device packages which include passive components may be similar or the same as those shown in the drawings but may include one or more passive components where the one or more die are shown in the drawings.

Implementations of semiconductor packages disclosed herein may utilize implementations of a method of forming a semiconductor device package. Implementations of the method include: contacting a plurality of electrical contacts on a first face of a passive component with an adhesive of an adhesive surface of an adhesive tape (which may be any disclosed). The method also include overmolding or encapsulating the passive component with a mold compound or an encapsulating compound where a portion of the plurality of electrical contacts on the first face of the passive component are not one of overmolded and encapsulated, forming the semiconductor device package. The overmolding or encapsulating compound may be any disclosed herein. The semiconductor package includes no lead frame. The method also includes removing the semiconductor device package from the adhesive surface where the portion of the plurality of electrical contacts on the first face of the passive component are positioned to electrically couple with one or more conductive paths included in a motherboard. As disclosed in this document, the one or more conductive paths form a distribution layer designed to distribute all electrical signals between the semiconductor device package and the motherboard and various components contained thereon. In various implementations such a semiconductor device package includes no wire bonds, and it may also include multiple passive components, a mixture of one or more passive components and one or more die, and/or one or more clips as disclosed herein in relation to other implementations.

Figure 14:
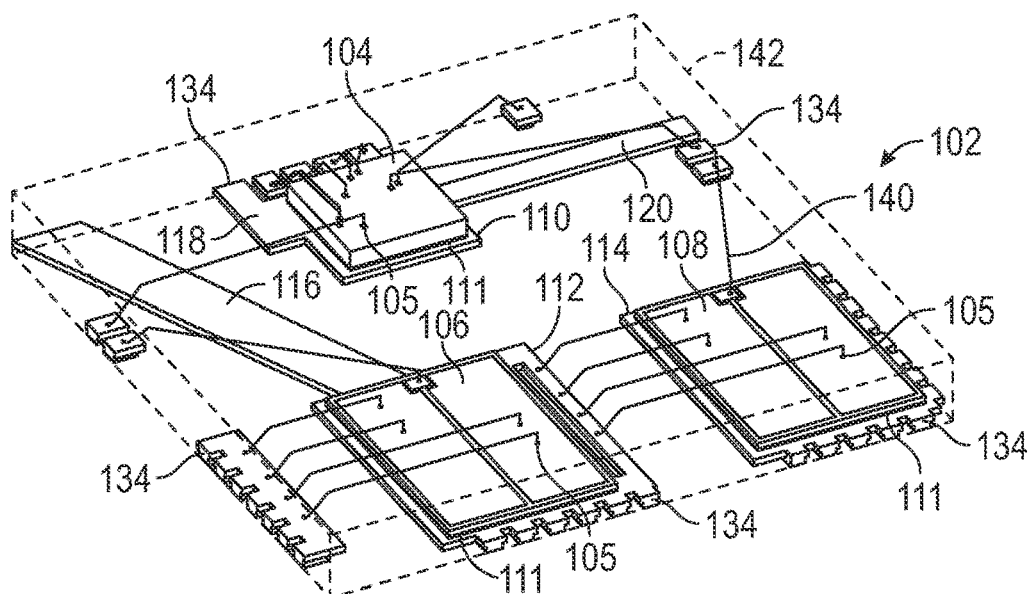
FIG. 14 is a top perspective see-through view of an implementation of a semiconductor package.
Figure 15:
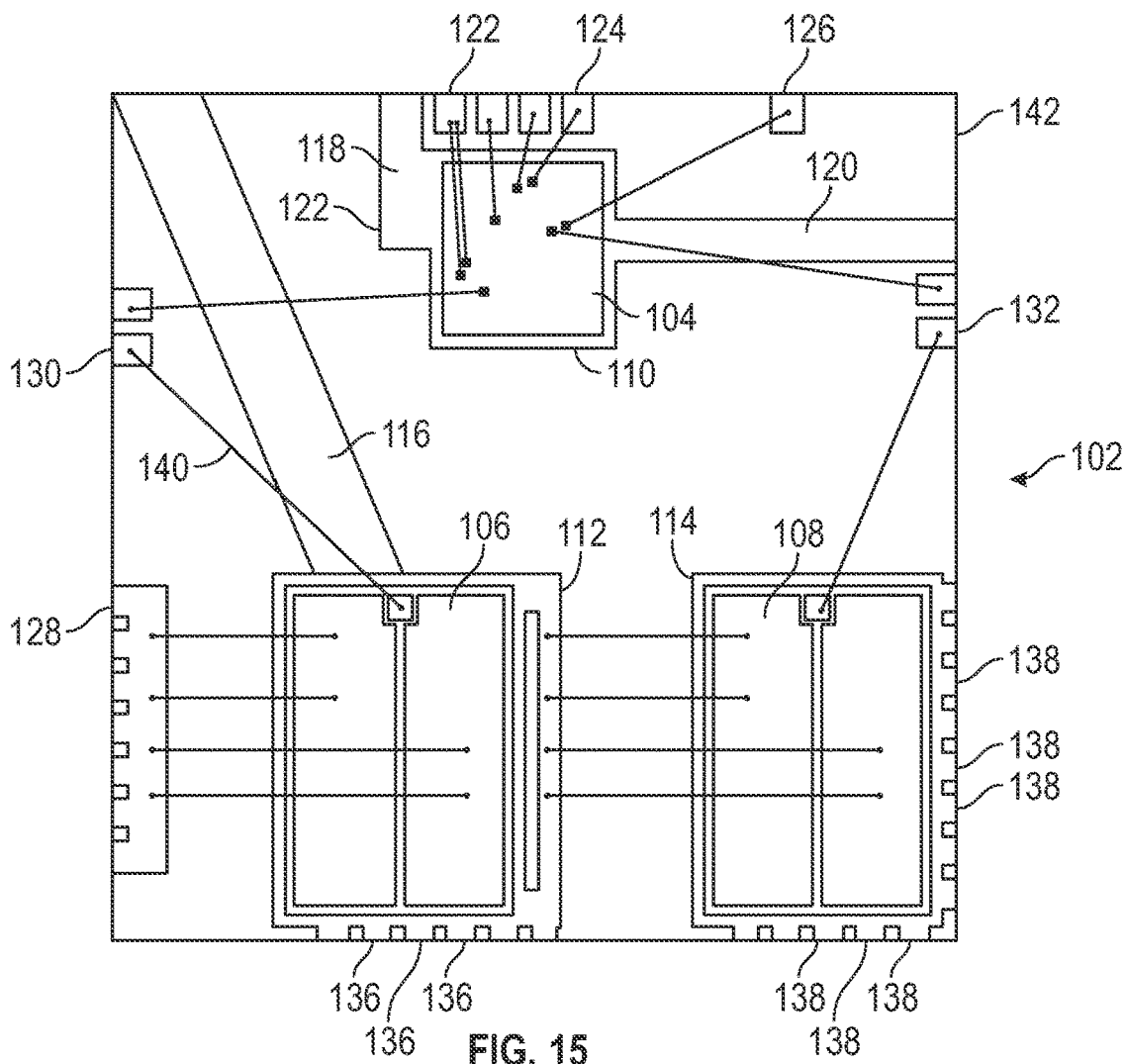
FIG. 15 is a top see-through view of the semiconductor package of FIG. 14.

Referring now to FIGS. 14 and 15, a semiconductor package (package) 102 is illustrated. The semiconductor package includes semiconductor die 104, 106 and 108 each attached to one of the die attach flags (flags) (die attach pads) 110, 112 and 114, respectively, using a die attach material 111. Each die includes a number of electrical contacts 105. Electrical connectors 140 (which in the illustrated package are wirebonds) are used to interconnect electrical contacts with other electrical contacts and/or with pins 134 of the package. Not all of the electrical contacts, electrical couplers and pins are pointed out in FIGS. 14 and 15, for ease of viewing other elements, but every wirebond that is shown in FIGS. 14-15 is attached to at least one electrical contact of a die. Not all of the electrical contacts of the die can be seen from the perspective and top view of FIGS. 14-15, either, because each die shown in FIG. 14 also has at least one electrical contact on an underside of the die, opposite the top sides shown in FIG. 15.

Each of the die attach flags is supported during fabrication of the illustrated package 102 by a lead frame. The lead frame is not shown in the drawings, but each of the pins 134, before singulation of the package 102, is directly physically coupled with the lead frame. This provides some support for the die attach flags, and support is also provided by tie-bars 116, 118 and 120, which directly couple the flags with the lead frame before singulation. For example, flag 110 is physically supported by tie-bars 118 and 120, each of which forms part of the lead frame (as does flag 110 itself) during fabrication of the package. Flag 112 is physically supported by tie-bar 116 and by pins 136, each of which forms part of the lead frame (as does flag 112 itself) during fabrication of the package. Flag 114 is physically supported by pins 138, each of which forms part of the lead frame (as does flag 114 itself) during fabrication of package 102. As can be seen, pins 136 and 138 are electrically shorted to flags 112 and 114, respectively.

During fabrication of package 102, the die are attached to the die attach flags, using a die attach material, and wirebonds are used to electrically interconnect electrical contacts of the die with one another and/or with the pins. An encapsulant 142 is then used to encapsulate the elements, forming an encapsulated assembly, and the assembly is then singulated to form package 102. The pins are exposed through the encapsulant and are used to electrically couple the package with, for example, a printed circuit board (PCB). The die attach flags, because they are supported by pins and tie-bars which are in turn integrally formed with the lead frame, support the die and wirebonds during fabrication so that no damage occurs to the die or wirebonds or the electrical connections between elements during fabrication.

The example package 102 illustrated in FIGS. 14-15 is an integrated driver and MOSFETs package (DrMOS). Die 104 is a metal-oxide-semiconductor field-effect transistor (MOSFET) driver, die 106 is a low side MOSFET (LS FET), and die 108 is a high side MOSFET (HS FET). The various elements of package 102 form electrical nodes, not all of which are pointed out in the drawings but, for example, referring to FIG. 15, the package includes a control signal ground (GND) node 122, a control input voltage (VCC) node 124, a bootstrap voltage (BOOT) node 126, a power ground (PGND) node 128, a gate input node 130 (for the LS FET), and a gate input node 132 (for the HS FET).

Some of the nodes of the package 102 are pointed out because, with a high voltage package such as package 102, sufficient electrical isolation distances between nodes are needed, such as large isolation distances between high and low voltage nodes. As examples, sufficient isolation is needed between the LS FET and the ground nodes, between the HS FET and the ground nodes, between the driver flag 110 and the die 106 and 108, between the die 106 and 108 and their gate inputs (130, 132), between the BOOT node 126 and the driver flag 110, and between the BOOT node and other driver nodes (not labeled in FIG. 15). Designs for high voltage packages are limited because of the need to both physically support the flags throughout the assembly process (which has been accomplished by having tie-bars, die attach flags and leads integrally formed with the lead frame for support and positioning of the die), and because of the need to isolate various electrical nodes of the package from one another.

Tie-bars are additionally generally exposed during singulation, adding to the need for large mechanical spacing due to large electrical potential differences. Furthermore, tie-bars may have to be routed between specific nodes to maintain proper isolation distances between some of the nodes (for example in FIG. 15 tie-bar 116 is seen extending far up and to the left to a corner of the package instead of directly to the left which would be a shorter distance, thus passing between nodes 122 and 130 instead of between nodes 130 and 128). The above details affect the form factor of a semiconductor package, as would be expected, since the isolation distances need to be considered with respect to the die, the flags, the leads/pins, and the tie-bars, and all of these elements nevertheless are incorporated together within the traditional package. There are, accordingly, many design considerations that go into a high voltage package.

While the above representative example of a high voltage package is given, and specifically that of a DrMOS package, this is not meant to explicitly or implicitly limit the applications with which no tie-bar semiconductor packages, which will be further discussed below, may be used. The DrMOS example for the traditional package, and the DrMOS example for the no tie-bar package, are only given to illustrate more clearly the differences between the elements and methods of formation of the package 102 and the various exemplary no tie-bar packages that are disclosed herein. High voltage packages are finding increased usage with advances in high power applications, and advances in wide band gap package solutions are useful, so the disclosed no tie-bar packages and methods may be used for high voltage packages (such as power controllers and/or converters). Nevertheless, the no tie-bar packages and methods disclosed herein may also be used for a variety of other types of packages other than DrMOS packages specifically, and with other die which are not high voltage die and/or power converters/controllers generally.

Figure 16:
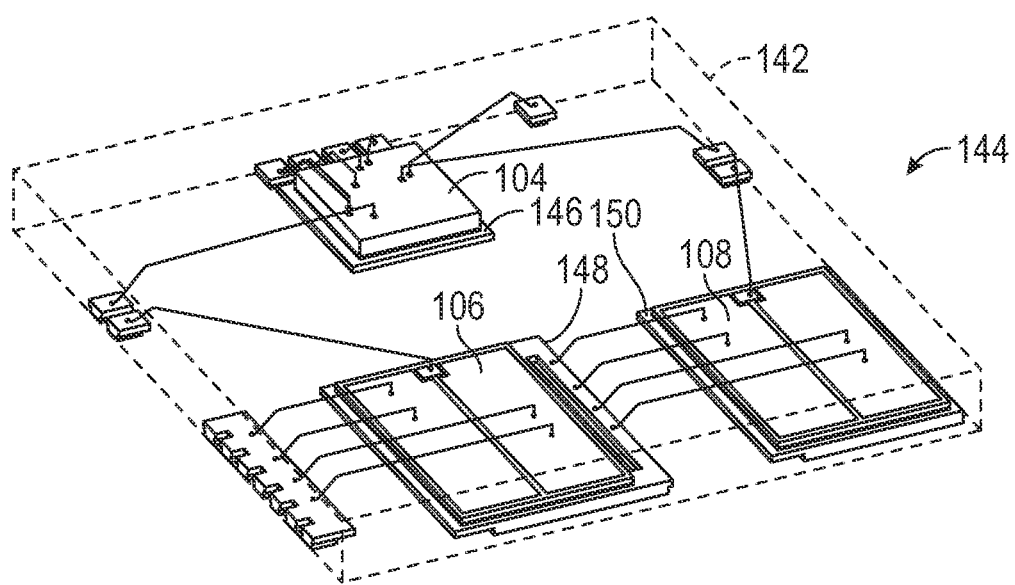
FIG. 16 is a top perspective see-through view of an implementation of a no tie-bar semiconductor package.
Figure 17:
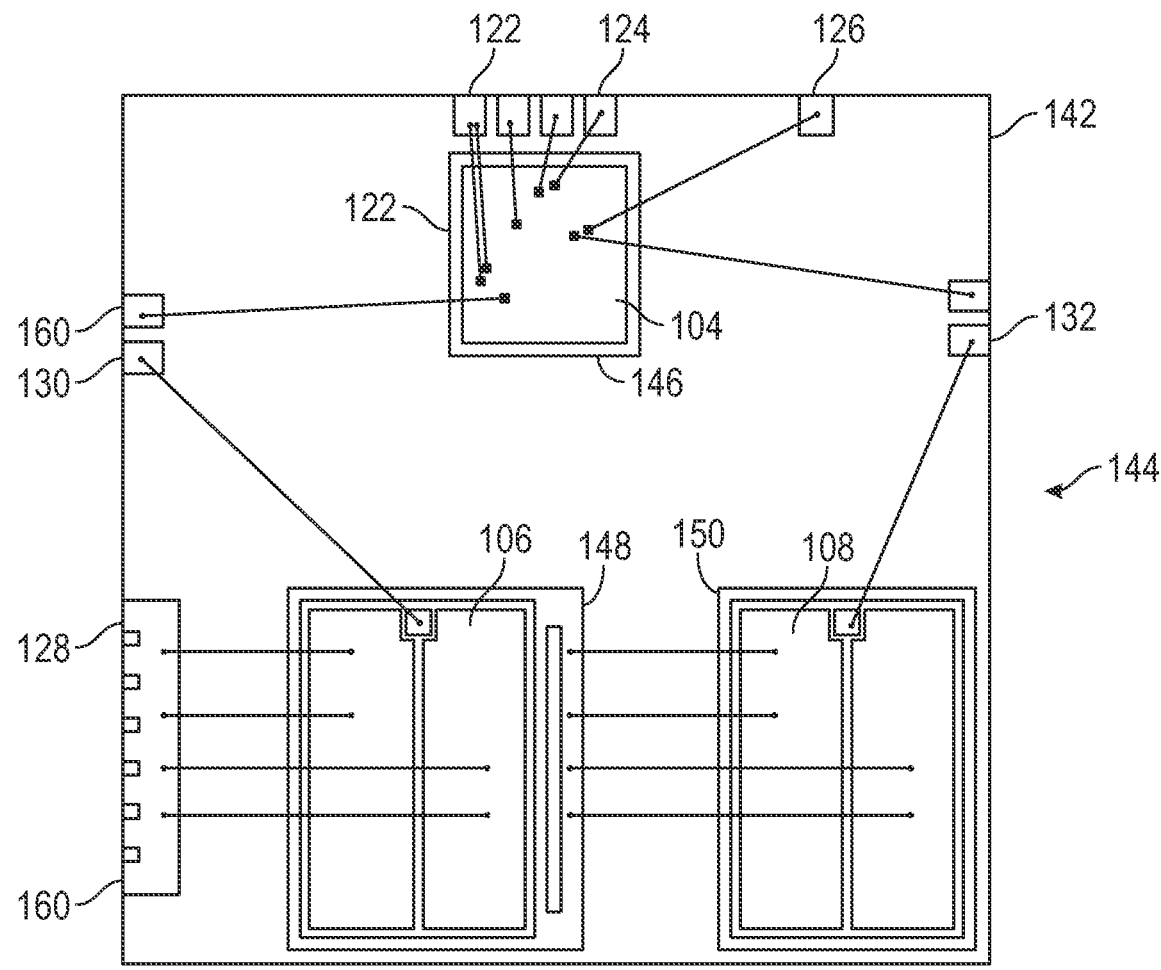
FIG. 17 is a top see-through view of the semiconductor package of FIG. 16.

Referring now to FIGS. 16-17, a representative example of a no tie-bar semiconductor package (package) 144 is given. Package 144 is seen to be, some ways, similar to package 102, but in some ways different. As discussed above, the specific example of a DrMOS package is presented, which includes semiconductor die 104 which is a MOSFET driver, die 106 which is a low side MOSFET (LS FET), and die 108 which is a high side MOSFET (HS FET). The die have the same electrical contacts 105 (these are not pointed out in FIGS. 16-17 but some of them are pointed out in FIG. 22). A number of pins 160 are seen, though there are not as many pins 160 as there are pins 134 of the package 102. This is at least in part because pins 136 and 138, which are used in the package 102 to support the HS FET and LS FET flags, are not needed for support in the no tie-bar package. There are accordingly no pins directly coupled with the flags of the LS FET or the HS FET of package 144.

The electrical nodes of the example no tie-bar package 144 are similar to those of the package 102, including the control signal ground (GND) node 122, the control input voltage (VCC) node 124, the bootstrap voltage (BOOT) node 126, the power ground (PGND) node 128, the gate input node 130 for the LS FET, the gate input node 132 for the HS FET, and other nodes not pointed out. Electrical connectors 140 are included (some of which are pointed out in FIG. 22), and in the representative example they are shown as wirebonds. In other implementations of no tie-bar packages, however, these could be other elements such as metallic clips or other non-wirebond elements. The electrical connectors 140 interconnect the electrical contacts of each die with electrical contacts of one or more other die and/or with the pins 160. Encapsulant 142 is seen to at least partially encapsulate each die and to fully encapsulate each electrical connector.

Package 144 is seen to have no tie-bars. Whereas with package 102 there are two tie-bars connecting flag 110 with the lead frame, and one tie-bar connecting flag 112 with the lead frame, prior to singulation, with the no tie-bar package 144 there are no tie-bars in the package at all. Additionally, the die attach flags (flags) (die attach pads) 146, 148, and 150 are not integrally formed with the lead frame from which the package 144 is formed. Since they are not integrally formed with the lead frame using either tie-bars and/or pins/leads, they are accordingly able to be placed anywhere within the central opening of the lead frame, taking into consideration any necessary isolation distances between elements. In that sense, they are "floating" flags. In FIGS. 16-17 the flags 146, 148 and 150 are seen to be located in roughly the same place as the flags 110, 112 and 114 of package 102, but this is only to emphasize the lack of tie-bars and differences in the shapes of the flags themselves. In other implementations the flags of package 144 may be in different locations than those shown in FIG. 17, and may be rotated at any angle.

Figure 18:
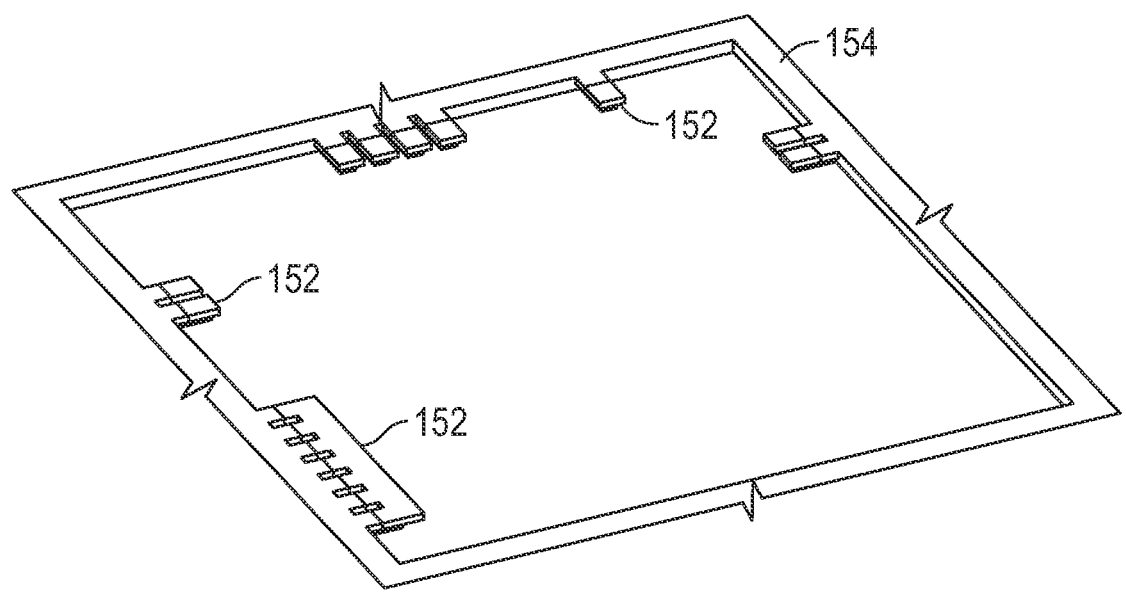
FIG. 18 is a top perspective view of a lead frame used in an example method of forming the semiconductor package of FIG. 16.
Figure 19:
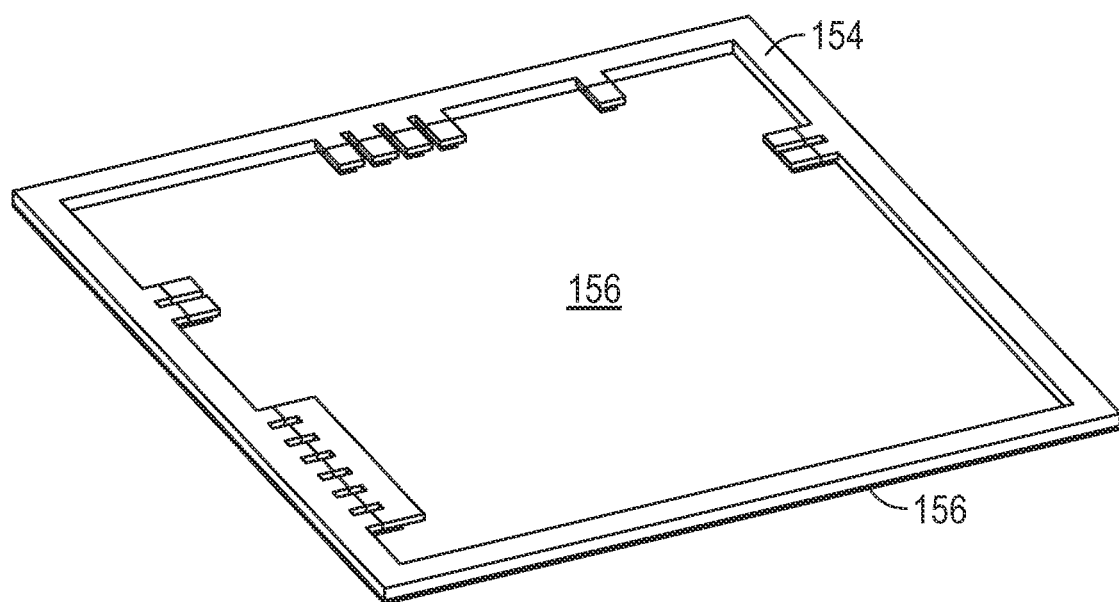
FIG. 19 is a top perspective view of an assembly formed during the example method of forming the semiconductor package of FIG. 16.

Referring now to FIGS. 18-24, a package implementation at various points of an implementation of a method of forming package 144 is illustrated. FIG. 18 illustrates a lead frame 154 having a number of leads 152 extending into a central opening of the lead frame. The lead frame 154 in FIG. 18 is represented as extending in all directions, i.e., the pattern shown in FIG. 18 may be repeated in an array, so that the portion shown in FIG. 18 is repeated one or more times in each direction so as to facilitate the fabrication of multiple semiconductor packages using a single lead frame array/panel. In other implementations, however, the lead frame may be a single unit (as depicted in FIG. 19) and not an array, so that the lead frame is used to form only a single semiconductor package. This could be the case, by non-limiting example, for multi chip modules (MCMs) and relatively large semiconductor packages, though it could also be used for smaller packages as well.

In FIG. 18 the leads of the lead frame are all illustrated with a line across them. This may be, in implementations, a score line or a location of the lead where the thickness of the lead is thinner so as to facilitate easier separation of a portion of each lead during singulation (when the leads are severed and the portions remaining in the leadless package become pins or lands of the package). In other implementations singulation may occur without any score lines or thinned portions of the leads being present.

The lead frame 154 illustrated in FIG. 18 is only a representative implementation based on a specific DrMOS module. The leads could be placed in any number, and in any location around the perimeter of the lead frame, depending on the desired final pinout for the finished semiconductor package. The leads could also be separated from the lead frame during singulation in a way so as to create a semiconductor package with leads extending from the encapsulant (i.e., the leads not separated flush with the encapsulant), or the leads could be separated from the lead frame flush with the encapsulant to form a leadless frame having only pins/lands that are flush (or substantially flush) with the encapsulant, and on any or all sides of the package to form any type of flat no-leads package.

FIG. 19 illustrates tape 156 coupled with the lead frame 154. The tape is illustrated here as having the same perimeter as the lead frame, though if the lead frame is in an array as discussed above the tape may be sized and shaped to fit over the full array. An adhesive surface of the tape is facing upwards in FIG. 19 so that elements may be placed thereon to form the package. In implementations the tape may be a high temperature tape configured to retain its shape and adhesiveness at temperatures exceeding 240 degrees Celsius. Tapes having other temperature limits may be used, and even non-high temperature tapes may be used in some circumstances. A high temperature tape is useful in implementations in which wirebonds are used for the electrical connectors because a temperature of 240 degrees Celsius may be used during wirebonding. A high temperature tape may also be useful in implementations in which a die attach material needs to be reflowed and/or cured. In other implementations, however, the wirebonds may be excluded and clips or other elements may be used which do not require a heating step, and/or die attach material may not need to be reflowed/cured (or may be excluded altogether), and in those implementations the tape may not be a high temperature tape. In implementations the tape has a thin adhesive layer of 3 mils or less. The use of an adhesive 3 mils or less may aids in less flexing of the tape and/or indentation of the tape during wirebond and mold. In various implementations, the tape itself can be thicker provided the adhesive is within this range of thicknesses to reduce/limit compression which may aid in package robustness.

Figure 20:
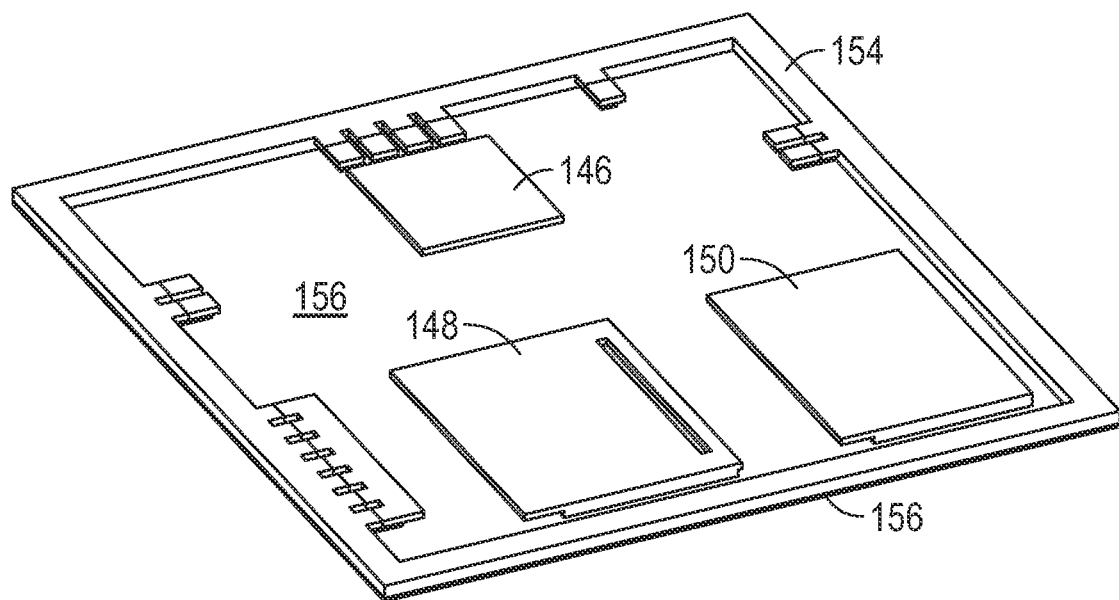
FIG. 20 is a top perspective view of another assembly formed during the example method of forming the semiconductor package of FIG. 16.

In FIG. 20 a number of die attach flags (flags) have been attached to the tape 156. Flag 146 (which in this representative example is for the driver FET) is seen to have no tie-bars coupling it to the lead frame, and additionally no leads coupling it with the lead frame. The flag is not electrically coupled with the lead frame when it is placed on the tape. In the example the flag 146 is placed down in the location shown but, since its location is not dictated by the need to have one or more tie-bars connected to it, the flag could in other implementations be placed in any other location on the tape and rotated at any angle (while retaining any desired isolation distances).

Flag 148 (in this example for the LS FET) is attached to the tape and is seen to have no tie-bars coupling it with the lead frame, and additionally no leads coupling it with the lead frame (as opposed to pins 136 of FIG. 15 which, prior to being severed during singulation, each formed part of a lead coupling flag 112 with a lead frame). The flag 148 is not electrically coupled with the lead frame when it is placed on the tape, and similar to flag 146 it could be placed in any location other than that shown, and rotated at any angle, while retaining any desired isolation distances.

Flag 150 (in this example for the HS FET) is attached to the tape and is seen to have no tie-bars coupling it with the lead frame, and additionally no leads coupling it with the lead frame (as opposed to pins 138 of FIG. 15 which, prior to being severed during singulation, each formed part of a lead coupling flag 114 with a lead frame). The flag 150 is not electrically coupled with the lead frame when it is placed on the tape, and similar to flag 146 and 148 it could be placed in any location other than that shown, and rotated at any angle, while retaining any desired isolation distances.

The die attach flags may be formed of any material, but in implementations they may be formed of an electrically and/or thermally conductive metal such as, by non-limiting example, copper. This could be useful to electrically couple an electrical contact on an underside of a die with the flag itself, and/or to draw heat out of the die towards a heat sink. Other electrically and/or thermally conductive materials (including electrically and/or thermally conductive metallic and non-metal materials) could be used in various implementations, however, and copper is an example. In various implementations, the flag may be made of a non-electrically conductive material (like a dielectric or other insulative material) or may have a non-electrically conductive material facing the tape (as when a multilayered material is used as the flag which may have one or more electrically conductive layers but a non-electrically conductive layer facing the tape).

The die attach flag may be pre-plated/pre-coated with a die attach material at the top surface that may, in particular implementations, be reflowed to attach the die. For example a copper flag may be pre-plated at its top surface with a thin solder layer (or a layer of metal having a lower melting point than the flag) so that, upon heating the layer and/or flag up to a certain temperature, the layer reflows and the die may be attached to the reflowed layer. The layer may then be allowed to cool to solidify and fix the die to the flag. In some implementations the die attach material may accordingly be a solid which is heated to melt, then allowed to cool to solidify. In other implementations the die attach material could be a double-sided tape (electrically conductive or not) or a liquid which is cured or sets through heat and/or a drying or chemical process, such as an epoxy (again either electrically conductive or not).

In some implementations an electrically and/or thermally conductive flag may not be used. For example, isolating the underside of a die electrically and/or thermally from a PCB and/or other element to which the package will be coupled may be the purpose of the particular flag/package structure. In other implementations the die may not have any electrical contacts on its underside, so there may be no need to use an electrically conductive die attach flag. In such instances the flag for a die could be formed from a ceramic material and/or a material that is otherwise not electrically and/or thermally conductive, or has very low electrical/thermal conductivity.

In still other implementations one or more or all of the die attach flags may be excluded altogether. For example, in some implementations a bare die could be placed directly on the tape, instead of using a die attach flag at all. In some implementations, the side of the die facing the tape may be electrically non-conductive or substantially electrically non-conductive (as when the bare semiconductor substrate material of the die is exposed) or the side of the die may be electrically conductive. In implementations where the back side of the die is electrically conductive, this could occur where the underside of the die, along with any electrical contacts thereon (if any), are left exposed through the encapsulant. In other implementations a die could be left with a wafer backcoat/backside metal and the wafer backcoat/backside metal could be placed directly on the tape instead of on a flag, so that the die is fully isolated (or in other words fully electrically insulated and/or at least partially thermally insulated from the PCB or other element to which the package will be coupled). There may be various benefits to the different approaches. The placement of die directly on the tape may reduce steps and materials so that fabrication may be faster, while the placement of die on flags may increase stability (and reduce movement) of die during fabrication (such as by using a flag with a greater footprint than the die), may reduce movement of the die during attachment of electrical connectors and encapsulation, may reduce stress on wirebonds (if any) during wirebonding and/or encapsulation, and may be useful to draw more heat from the die to a heat sink, in some cases.

Figure 21:
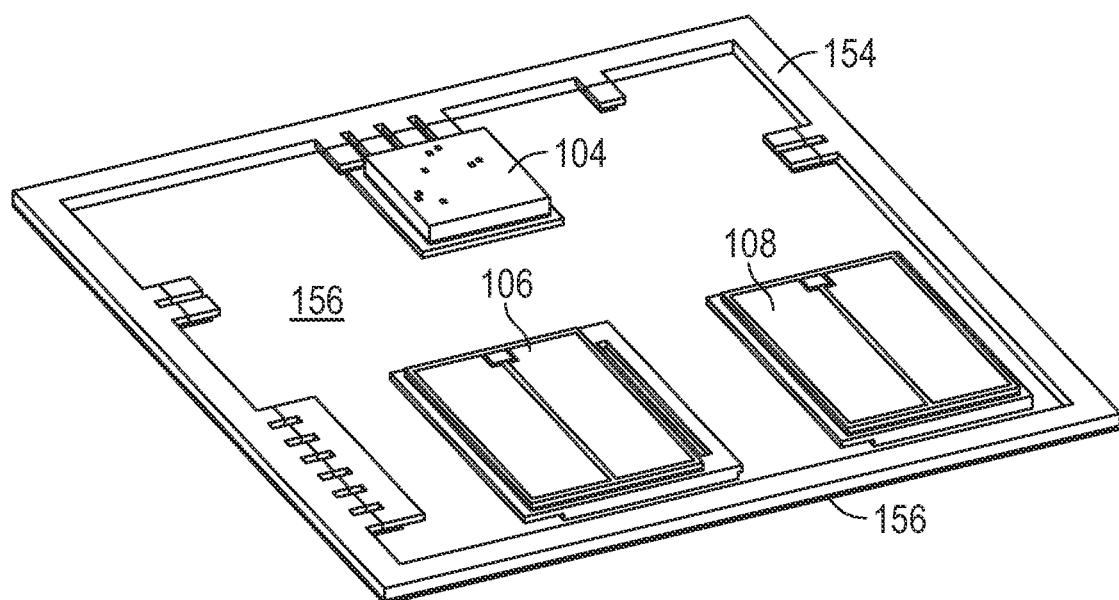
FIG. 21 is a top perspective view of another assembly formed during the example method of forming the semiconductor package of FIG. 16.

In FIG. 21 a die has been placed on each of the flags. Die 104 (in this example the driver FET) is attached to flag 146, die 106 (in this example the LS FET) is attached to flag 148, and die 108 (in this example the HS FET) is attached to flag 150. The die may be formed of any substrate type. In the implementation shown the die are silicon die, but in other implementations they could be, by non-limiting example, gallium nitride (GaN), silicon carbide (SiC), and/or any other semiconductor substrate material.

Figure 22:
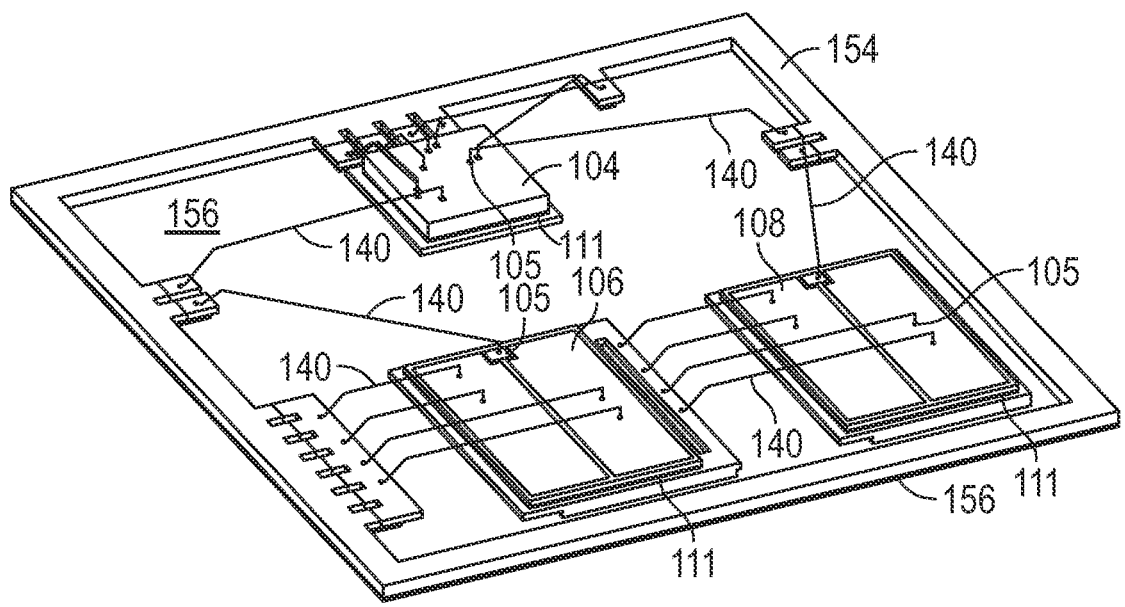
FIG. 22 is a top perspective view of another assembly formed during the example method of forming the semiconductor package of FIG. 16.

As illustrated in the implementation illustrated in FIG. 21, each die has at least two electrical contacts. Eight electrical contacts on the top surface of die 104 are seen in FIG. 21, and die 104 also has an electrical contact on its underside, opposite its top surface, which is electrically coupled with the flag 146. Die 106 and 108 each have a gate input electrical contact, outlined as the smallest rectangle on the top surface of those die, and each also has an electrical contact on its bottom surface which is electrically coupled with its respective flag. FIG. 22 points out a few of the electrical contacts 105 of the die, but not all, but the placements of the electrical connectors 140 reveal the electrical contacts, as every coupling of an electrical connector 140 with one of the die is done at an electrical contact of that die. Not all of the electrical connectors 140 are called out in FIG. 22, for ease of viewing all the elements, but all of the electrical connectors are clearly visible. The die may have more or fewer electrical contacts, and in other places than those shown in the drawings, and the electrical contacts shown are only representative examples.

In implementations the die are attached to the die attach flags using a die attach material. Depending on the type of die attach material used, after the die are placed the die attach material may be cured, heated, compressed, and/or reflowed to secure the die in place. In implementations in which the bottom surface of a die has an electrical contact that needs to be electrically coupled with the underlying flag, the die attach material may be chosen so as to be electrically conductive. In implementations in which the bottom of a die should be electrically isolated from the flag or in implementations in which electrical coupling is not needed, the die attach material may be a dielectric material or may otherwise have low or relatively no electrical conductivity. In implementations in which the bottom of a die has a thermal pad or the like to draw heat out of the die, the die attach material may be chosen so as to be highly thermally conductive to draw heat away from the die and towards a heat sink coupled with a PCB to which the semiconductor package will be coupled.

In some implementations, the die attach material may not be needed. For example, implementations discussed above which exclude a flag altogether (in which a die is placed directly on the tape, or in which a wafer backside of a die is placed directly on the tape) would not need a die attach material. Additionally, in some implementations a die may have sufficient stability on a flag without die attach material so that die attach material is not needed, or the processing steps may not tend to move the die so that a die attach material is not needed. For example, in implementations in which clips are laid on top of die and/or reflowed to attach to the die, instead of using wirebonds, there may be less likelihood of moving the die during packaging even if no die attach material is used. The exclusion of die attach material may have the advantage of less material use and a quicker fabrication process, while the inclusion of a die attach material may have the advantages of greater die stability (less potential movement) during fabrication and less likelihood of straining wirebonds if wirebonds are used.

As illustrated in FIG. 22, after the die are coupled with the tape, either directly or by attachment to flags, electrical connectors 140 are used to interconnect various elements. Some electrical connectors may be used to couple electrical contacts of the die with one another. For example, in FIG. 22 some electrical connectors are seen electrically coupling electrical contacts on the topside of die 108 with flag 148 which, in turn, electrically couples with one or more electrical contacts on the underside of die 106. Other electrical connectors are used to interconnect electrical contacts of the die with leads of the lead frame. For example, each die in FIG. 22 is seen having at least one electrical contact electrically coupled with a lead using an electrical connector.

The example of FIG. 22 illustrates wirebonds used as the electrical connectors. One advantage of using wirebonds is that they may be convenient for interconnecting many electrical contacts of the die within the package itself. Other electrical connector types are possible, though, and may be used in the place of or in combination with wirebonds. Clips may be electrically coupled with one or more electrical contacts, and one or more surfaces of the clips may be exposed through the encapsulant after singulation, so that one or more of the electrical contacts of the die could be electrically coupled together outside the package itself, such as through a PCB. Clips may allow for simple fabrication (one clip may take the place of several wirebonds) and/or decreased likelihood of failed electrical connections during packaging, while nevertheless demanding greater interconnectivity from the PCB itself. Clips may achieve some interconnections between electrical contacts of die internal to the package, (for example the four wirebonds shown connecting the HS FET of FIG. 22 with the flag of the LS FET could, in implementations, be replaced with a single clip). In the example shown in the drawings, wirebonds are used and none of the electrical contacts of the die are exposed through the encapsulant—some interconnects between die are thus facilitated internally within the package without relying on a PCB to interconnect the die.

In implementations the placement of the flags, die and/or interconnections through electrical connectors may be done without vacuum assist. This may allow for less complicated, quicker and/or less expensive fabrication process. In other implementations vacuum assist may be used to facilitate placement of the flags, die and/or electrical connectors. In implementations in which vacuum assist is used, a vacuum chuck abutting the underside of the tape may securely keep the tape in a flat configuration and may prevent undesired movement of the flags during and/or after placement and, in turn, undesired movement of the die during and/or after die placement. Vacuum assist may also help to ensure wire strength of any wirebonds by preventing stress on the wirebonds from undesired movement of the die and/or flags during the bonding process and during processing prior to and during encapsulation. Other advantages of either approach exist, and those disclosed herein are only representative examples.

Figure 23:
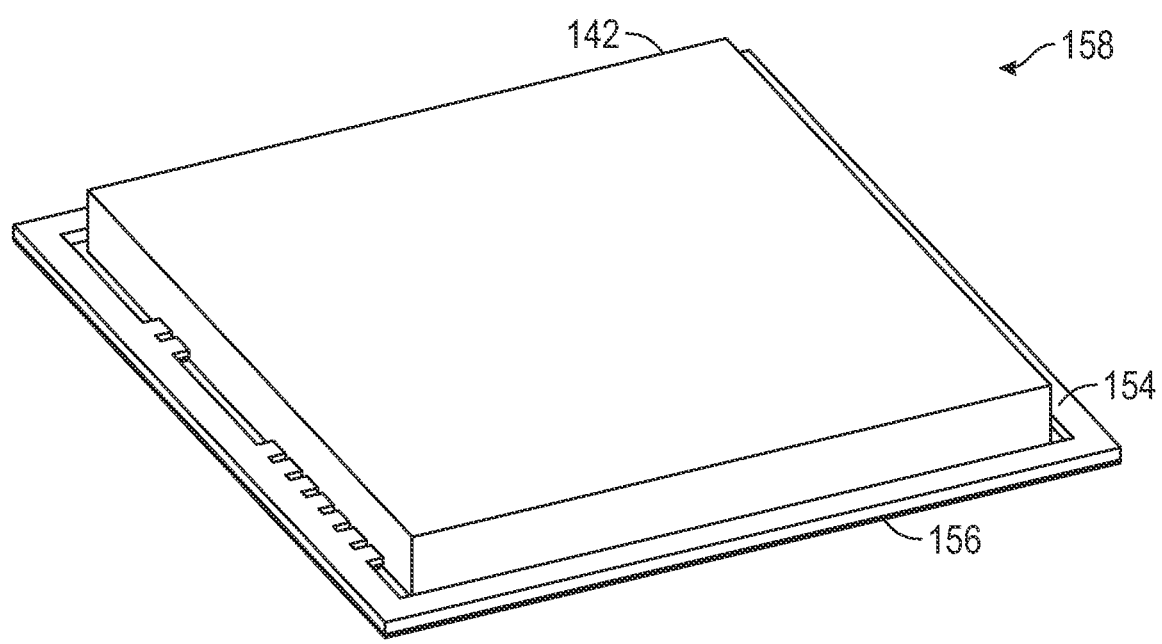
FIG. 23 is a top perspective view of an encapsulated assembly formed during the example method of forming the semiconductor package of FIG. 16.

As illustrated in FIGS. 22-23, after interconnecting elements of the die and/or leads using electrical connectors, the die and electrical connectors may be at least partially encapsulated using an encapsulant 142 to form an encapsulated assembly 158. In implementations the tape acts as a film assist during this process. For example, the tape may have a high affinity for the encapsulant material in liquid form so that the encapsulant material has low surface tension on the tape. This behavior will tend to cause the encapsulant material to fill in all desired areas during encapsulation without leaving any voids in the package. Additionally, the tape may be useful to prevent bleeding of the encapsulant material from a mold. For example, a mold may be placed in contact with the tape (and over and around the die) and the contact of the mold with the tape may help to prevent bleeding of the liquid encapsulant outside of the mold. In other implementations the mold may not contact the tape directly during encapsulation. In implementations the tape may help to prevent the liquid encapsulant from bleeding out from underneath the lead frame because the tape may act as a barrier to the liquid encapsulant, it being adhered to the bottom of the lead frame.

Figure 24:
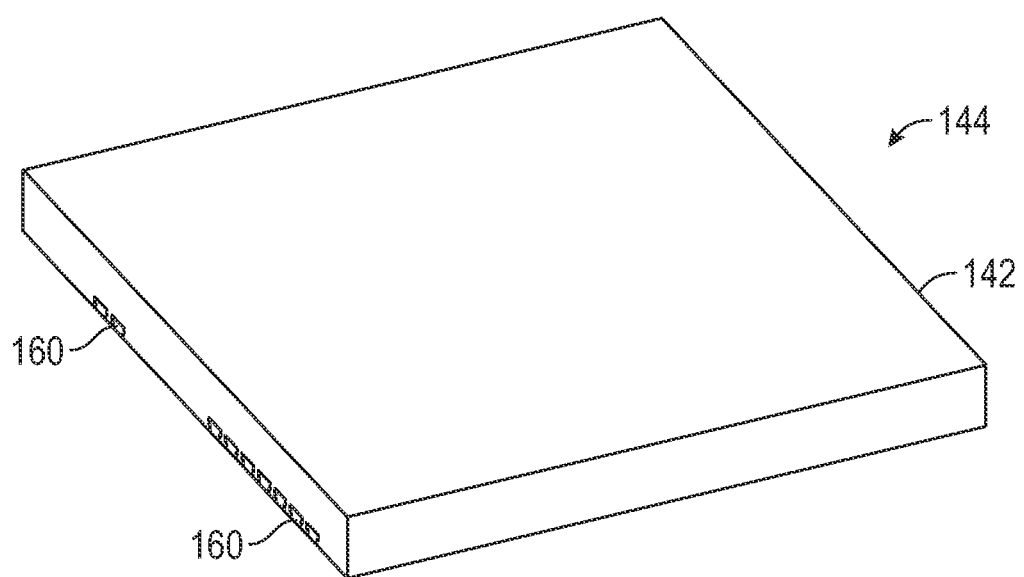
FIG. 24 is a top perspective view of the semiconductor package of FIG. 16.

After the encapsulant has solidified such as through a drying or curing process, the tape is removed from the underside of the encapsulated assembly 158 and the encapsulated assembly is singulated to form the no tie-bar semiconductor package 144, as seen in FIG. 24. The leads 152 are severed during the singulation process (flush with the encapsulant, in the shown example) so that they form lands or pins 160 which are exposed through the encapsulant 142. In implementations the tape removal may be done after singulation, and in that case the tape is removed from the semiconductor package itself. In implementations in which the tape is removed prior to singulation the tape is removed from the encapsulated assembly. If the encapsulated assembly is part of an array of encapsulated assemblies, and the tape is removed prior to singulation, then the tape may be removed from the entire array of encapsulated assemblies. The method steps recited in the claims are not all necessarily listed in order and, accordingly, in places where the claims refer to detaching the tape from the encapsulated assembly or the semiconductor package, this is meant to indicate that the tape removal may either occur before singulation (hence the tape being removed from the encapsulated assembly) or after singulation (hence the tape being removed from the semiconductor package). Following removal of the tape, the package may then in various implementations proceed to a lead finishing operation where the material of the leads is treated and/or cleaned.

FIG. 24 shows a top view of the package 144 with the pins/leads exposed through the sides of the package, through the encapsulant. Although the bottom of the package is not shown, the leads 160 of FIG. 24 are also exposed through the bottom of the package, through the encapsulant, as one would envision when reviewing the location of the leads in FIG. 22 and considering that the bottom of each lead is attached to the tape directly. Hence after encapsulation and removal of the tape the bottom of each pin is exposed through the bottom of the encapsulant.

As used herein, the terms "partially encapsulated," "fully encapsulated" and their variants have specific meanings. Referring to FIGS. 22-23, each of the die, after the encapsulation step, is considered to be fully encapsulated in the encapsulant, even though there is no encapsulant directly below each die (but rather a flag), because each die is fully surrounded by a combination of encapsulant and elements that are themselves at least partially encapsulated within the encapsulant. Each die attach flag is only partially encapsulated in the encapsulant, as is each pin, because a portion of the surface of each of these elements are exposed through the encapsulant. Each electrical connector of FIGS. 22-23 is fully encapsulated in the encapsulant, using the same reasoning. In implementations in which clips or other electrical connectors are used instead of wirebonds, if any portion of a clip/connector is exposed through the encapsulant then that clip/connector would be only partially encapsulated in the encapsulant. In implementations, discussed above, in which a die is directly placed on the tape without being placed on a flag, the resulting package would leave that die only partially encapsulated in the encapsulant, as the bottom side of that die would be exposed through the encapsulant.

In the methods shown and described, after the die are coupled with the tape (directly or by attachment to flags) there is no etching step (apart from, if at all, etching during singulation). Furthermore, in various implementations, after the encapsulation step there is, apart from singulation, no sawing, etching, or cutting of the lead frame elements or of the encapsulant. Rather, a single singulation step itself is the only step needed after encapsulation to finish forming the leads into pins and sever the package from the lead frame. In other implementations, however, a two step or multi-step singulation process could be used. As indicated previously, the leads could be left to extend outside of the package to form a package with leads, if desired, though in the examples shown in the drawings the leads are severed flush with the encapsulant to form a no-leads package. The singulation step itself could be done using any of a number of techniques including punching, scribing and breaking, sawing, cutting, etching, laser or plasma ablation/dicing, and so forth. There is also, in various implementations, only a single encapsulation/molding step. The lack of etching after die placement (apart from, if at all, etching during singulation), the use of only a single encapsulation step, and the lack of any need for later etching, sawing, or cutting of the encapsulant and/or lead frame elements (apart from singulation) after encapsulation, results in a simplified and quick fabrication process. While the use of a single encapsulation step is illustrated in this document, multiple encapsulation steps/processes could be used in various package implementations.

In experiments to test the viability of the above methods and packages a layout similar to FIG. 15 was used except with tie-bars 118 and 120 and flag 110 not present. High temperature tape was applied to the underside of the lead frame and a floating flag (movable to any position) was placed in the location where flag 110 is shown in FIG. 15. Vacuum assist was used to hold down the floating flag during die attach and wirebonding. The tie-bar 116 and leads which form pins 136 and 138 were left in place as in FIG. 15. After encapsulation, x-ray examination was used to determine the position of the floating flag and corresponding die in the encapsulated assembly, and it was determined that neither moved, or that in other words the tape was strong enough to keep the floating flag and its corresponding die in place during encapsulation. Furthermore, in further experiments wire pull tests were performed after wirebonding and it was found that there was no difference in wire strength between wirebonds on die attached to floating flags and wirebonds on die attached to flags secured through tie-bars and/or leads.

Although the representative examples in the drawings include packages which each include a plurality of die, any of the methods disclosed herein may also be used to form semiconductor packages which each only include a single die.

In general, the ability of using flags that are free to be placed in any location (floating flags) reduces package complexity and package design time. With the distances between low voltage and high voltage nodes naturally increased (for example, because of removal of tie-bars), and with no need to route tie-bars between specific nodes for isolation purposes, electrical isolation may be maintained while reducing the form factor of the package. The methods and devices disclosed herein also open up the design area of the package center. For example, a universal lead frame design may be used for a variety of different types of packages and devices, with only the modular flags, die and interconnecting electrical connectors changing. Because the flags do not need support directly from the lead frame, they may be placed anywhere within the lead frame opening.

In places where the description above refers to particular implementations of no tie-bar packages and methods of forming no tie-bar packages and implementing components, sub-components, methods and sub-methods, it should be readily apparent that a number of modifications may be made without departing from the spirit thereof and that these implementations, implementing components, sub-components, methods and sub-methods may be applied to other no tie-bar packages and methods of forming no tie-bar packages.

What is claimed is:

1. A method of forming a semiconductor package, comprising:
   providing a lead frame comprising a plurality of leads;
   attaching a tape to the lead frame;
   coupling one or more semiconductor die with the tape, wherein the one or more semiconductor die comprises a plurality of electrical contacts;
   electrically interconnecting one or more of the electrical contacts with one or more of the leads using electrical connectors;
   forming an encapsulated assembly, by at least partially encapsulating the one or more semiconductor die and at least partially encapsulating each of the electrical connectors, using an encapsulant;
   singulating the encapsulated assembly to form a semiconductor package; and
   detaching the tape from one of the encapsulated assembly and the semiconductor package.

2. The method of claim 1, wherein the semiconductor package comprises one of a power converter and a power controller.

3. The method of claim 1, wherein the electrical connectors comprise wirebonds.

4. The method of claim 1, further comprising attaching one or more die attach flags to the tape, wherein coupling the one or more semiconductor die with the tape comprises attaching the one or more semiconductor die to the one or more die attach flags using a die attach material.

5. The method of claim 4, wherein the one or more die attach flags are floating die attach flags.

6. The method of claim 4, further comprising using vacuum assist to hold down the one or more die attach flags while attaching the one or more semiconductor die to the one or more die attach flags, and using vacuum assist while electrically interconnecting one or more of the electrical contacts with one or more of the leads using the electrical connectors.

7. The method of claim 1, wherein the tape is configured to retain its shape and adhesiveness at temperatures exceeding 240 degrees Celsius.

8. The method of claim 1, wherein the tape comprises an adhesive layer of 3 mils or less.

9. The method of claim 1, wherein all of the electrical contacts of the one or more semiconductor die are fully encapsulated by the encapsulant of the semiconductor package.

10. The method of claim 1, further comprising etching used only for singulation after the one or more semiconductor die are coupled with the tape.

11. The method of claim 1, wherein the method comprises only one encapsulating step.

12. The method of claim 1, further comprising sawing used only for singulation after at least partially encapsulating the one or more semiconductor die using the encapsulant.

13. A method of forming a semiconductor package, comprising:
   providing a lead frame comprising a plurality of leads;
   attaching a tape to the lead frame;
   attaching a plurality of die attach flags to the tape;
   attaching a plurality of semiconductor die to the die attach flags using a die attach material, wherein each of the semiconductor die comprises a plurality of electrical contacts;
   electrically interconnecting one or more of the electrical contacts with one or more of the leads using electrical connectors;
   forming an encapsulated assembly, by at least partially encapsulating each of the semiconductor die and at least partially encapsulating each of the electrical connectors, using an encapsulant;
   singulating the encapsulated assembly to form a semiconductor package; and
   detaching the tape from one of the encapsulated assembly and the semiconductor package.

14. The method of claim 13, wherein the tape is configured to retain its shape and adhesiveness at temperatures exceeding 240 degrees Celsius and wherein the tape comprises an adhesive layer of 3 mils or less.

15. The method of claim 13, further comprising sawing used only for singulation after at least partially encapsulating the one or more semiconductor die using the encapsulant.

16. The method of claim 13, further comprising etching used only for singulation after the plurality of semiconductor die are coupled with the plurality of die attach flags.

17. The method of claim 13, wherein the method comprises only one encapsulating step.

18. The method of claim 13, wherein the semiconductor package comprises a flat no-leads package.

19. The method of claim 13, wherein the plurality of die attach flags are floating die attach flags.

20. The method of claim 13, wherein the plurality of die attach flags are separate from the lead frame.

* * * * *